(12) United States Patent
Lai et al.

(10) Patent No.: US 11,183,487 B2
(45) Date of Patent: Nov. 23, 2021

(54) INTEGRATED CIRCUIT PACKAGE AND METHOD

(71) Applicant: Taiwan Semiconductor Manufacturing Company, Ltd., Hsinchu (TW)

(72) Inventors: Chi-Hui Lai, Taichung (TW); Shu-Rong Chun, Hsinchu (TW); Kuo-Lung Pan, Hsinchu (TW); Tin Hao Kuo, Hsinchu (TW); Hao-Yi Tsai, Hsinchu (TW); Chung-Shi Liu, Hsinchu (TW); Chen-Hua Yu, Hsinchu (TW); Yu-Chia Lai, Zhunan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/589,758

(22) Filed: Oct. 1, 2019

(65) Prior Publication Data
US 2020/0212018 A1 Jul. 2, 2020

Related U.S. Application Data

(60) Provisional application No. 62/785,133, filed on Dec. 26, 2018.

(51) Int. Cl.
*H01L 25/10* (2006.01)
*H01L 23/31* (2006.01)
(Continued)

(52) U.S. Cl.
CPC .......... *H01L 25/105* (2013.01); *H01L 21/561* (2013.01); *H01L 21/563* (2013.01);
(Continued)

(58) Field of Classification Search
CPC ..... H01L 21/561; H01L 21/563; H01L 21/78; H01L 23/3121; H01L 23/32;
(Continued)

(56) References Cited

U.S. PATENT DOCUMENTS 7,170,165 B2  1/2007  Berto et al.
8,993,380 B2  3/2015  Hou et al.
(Continued)

FOREIGN PATENT DOCUMENTS

CN          1816248 A   8/2006
CN        105518860 A   4/2016
(Continued)

*Primary Examiner* — Allan R Wilson
(74) *Attorney, Agent, or Firm* — Slater Matsil, LLP

(57) ABSTRACT

A packaged semiconductor device including an integrated passive device-containing package component disposed between a power module and an integrated circuit-containing package and a method of forming the same are disclosed. In an embodiment, a device includes a first package component including a first integrated circuit die; a first encapsulant at least partially surrounding the first integrated circuit die; and a redistribution structure on the first encapsulant and coupled to the first integrated circuit die; a second package component bonded to the first package component, the second package component including an integrated passive device; and a second encapsulant at least partially surrounding the integrated passive device; and a power module attached to the first package component through the second package component.

20 Claims, 46 Drawing Sheets

(51) Int. Cl.
*H01L 23/498* (2006.01)
*H01L 23/00* (2006.01)
*H01L 23/32* (2006.01)
*H01L 23/42* (2006.01)
*H01L 25/00* (2006.01)
*H01L 21/78* (2006.01)
*H01L 21/56* (2006.01)
*H01L 23/367* (2006.01)

(52) U.S. Cl.
CPC .......... *H01L 21/78* (2013.01); *H01L 23/3121* (2013.01); *H01L 23/32* (2013.01); *H01L 23/367* (2013.01); *H01L 23/42* (2013.01); *H01L 23/49811* (2013.01); *H01L 24/16* (2013.01); *H01L 24/69* (2013.01); *H01L 25/50* (2013.01); *H01L 21/568* (2013.01); *H01L 2224/16227* (2013.01)

(58) Field of Classification Search
CPC ... H01L 23/367; H01L 23/4006; H01L 23/42; H01L 23/49811; H01L 24/16; H01L 24/69; H01L 25/105; H01L 25/16; H01L 25/50
See application file for complete search history.

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,859,262 B1 | 1/2018 | Patel et al. | |
| 10,304,801 B2 | 5/2019 | Huang et al. | |
| 10,354,964 B2 | 7/2019 | Yu et al. | |
| 10,515,904 B2 | 12/2019 | Lin et al. | |
| 10,529,698 B2 | 1/2020 | Yu et al. | |
| 2002/0012231 A1* | 1/2002 | Bhatia | H01L 23/42 361/704 |
| 2007/0278669 A1* | 12/2007 | Hierholzer | H01L 25/072 257/718 |
| 2010/0327654 A1* | 12/2010 | Azuma | H05K 7/1432 307/9.1 |
| 2016/0329272 A1* | 11/2016 | Geissler | H01L 24/81 |

FOREIGN PATENT DOCUMENTS

| | | |
|---|---|---|
| CN | 207367957 U | 5/2018 |
| KR | 20160088233 A | 7/2016 |
| TW | 201803048 A | 1/2018 |
| TW | 201820573 A | 6/2018 |
| TW | 201830635 A | 8/2018 |
| TW | 201832343 A | 9/2018 |
| TW | 201836066 A | 10/2018 |

* cited by examiner

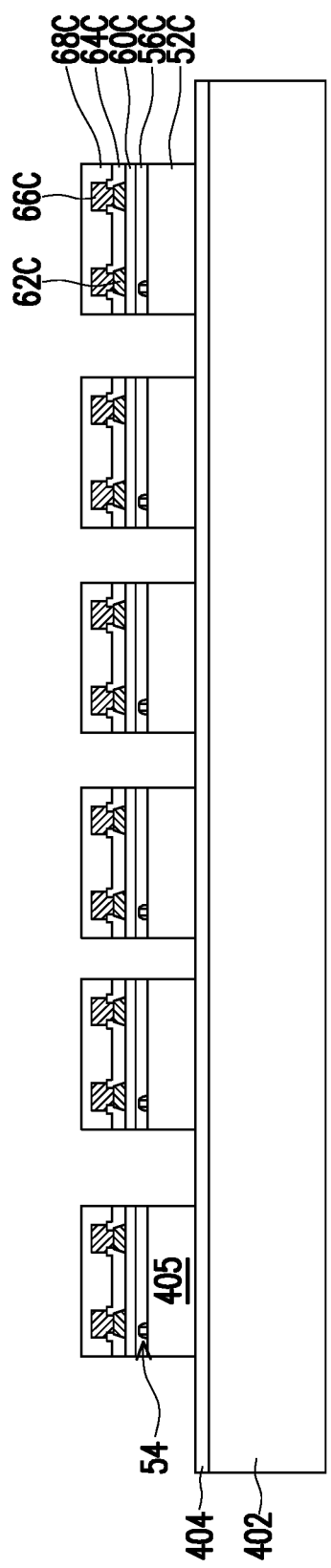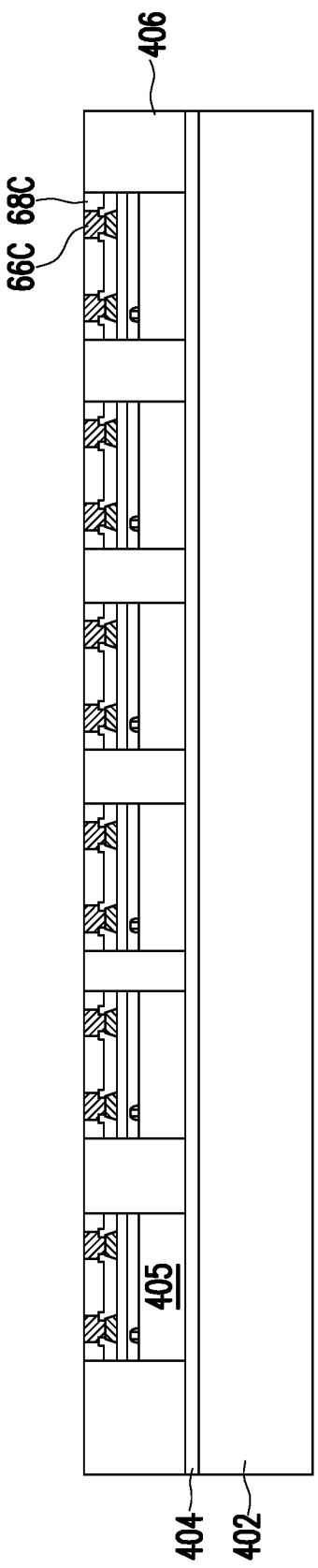

INTEGRATED CIRCUIT PACKAGE AND METHOD

PRIORITY CLAIM AND CROSS-REFERENCE

This application claims the benefit of U.S. Provisional Application No 62/785,133, filed on Dec. 26, 2018, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is package-on-package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 19-24 illustrate cross-sectional views of intermediate steps during a process for forming a system-on-wafer (SoW) package, in accordance with some embodiments.

DETAILED DESCRIPTION

Figure 1:
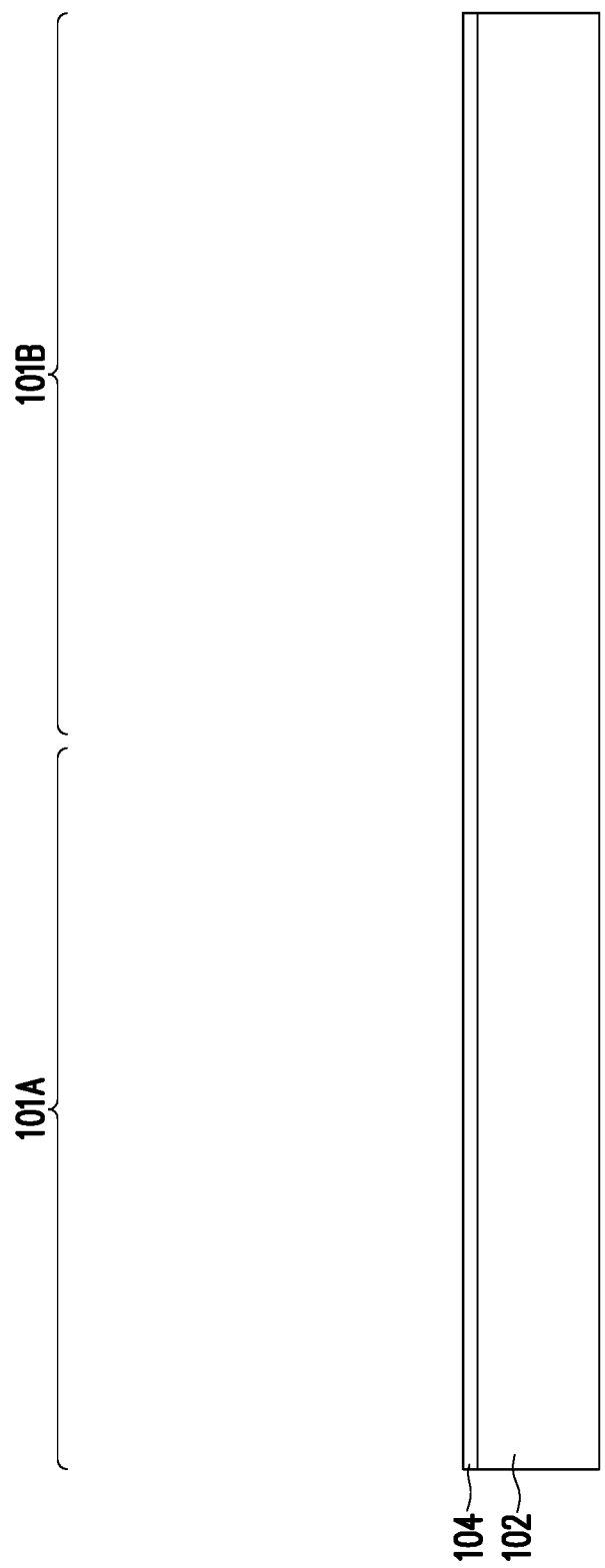
FIGS. 1-4, 5A, 5B, 6-15, 16A-16C, 17A-17C, 18A-18E illustrate cross-sectional views of intermediate steps during a process for forming first packages, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While embodiments are described in detail below, a general description of the present disclosure is provided herein. In a general sense, the embodiments described herein provide for a package wherein integrated passive devices (IPDs) are packaged and integrated into a system-on-wafer (SoW) package (e.g., a super large fan-out wafer-scale package) by stacking IPD packages between a power module (sometimes referred to as a socket) and an integrated fan-out (InFO) structure. Embodiment SoW packages may include any combination of interconnected functional dies in a package area of 10,000 mm$^2$ or greater. For example, the interconnected functional dies within a SoW package may provide each component of a complete electrical system to provide high performance computing (HPC) (e.g., an accelerator of an artificial intelligence (AI) server, a cloud computing system, an edge computing system, or the like) in a data center application, a server application, or the like. The power modules may be connected to the functional dies of the SoW package through the IPD packages. Each power module may provide power management for a single functional die or a plurality of functional dies within the SoW package.

Advantageous features of some or all of the embodiments described herein may include a shorter distance between IPDs and the functional dies, which may enhance the power distribution network (PDN) performance. Some embodiments may provide integration of 3D stacked IPDs with InFO processes, thus making adoption of the embodiments practical. In some embodiments, 3D stacking of IPDs avoids the need of removing ball grid array (BGA) connectors from the socket landscape (e.g., the footprint of a package), allowing for improved current handling through increased area (e.g., more BGA connectors) for current handling.

FIGS. 1 through 16C illustrate cross-sectional views of intermediate steps during a process for forming a first package component 100, in accordance with some embodiments. The first package component 100 is an IPD package comprising one or more IPDs, which may be implemented between a module (e.g., a module 160 illustrated in FIGS. 17A-17C) and an SoW package (e.g., an SoW package 400 illustrated in FIG. 24) according to various embodiments. FIG. 1 illustrates a first package region 101A and a second package region 101B in which one or more IPDs, such as IPDs 50A discussed below in reference to FIG. 4, may be packaged.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV light. The release layer 104 may be dispensed as a liquid and cured, may be a laminate film laminated onto the carrier substrate 102, or may be the like. A top surface of the release layer 104 may be leveled and may have a high degree of planarity.

Figure 2:
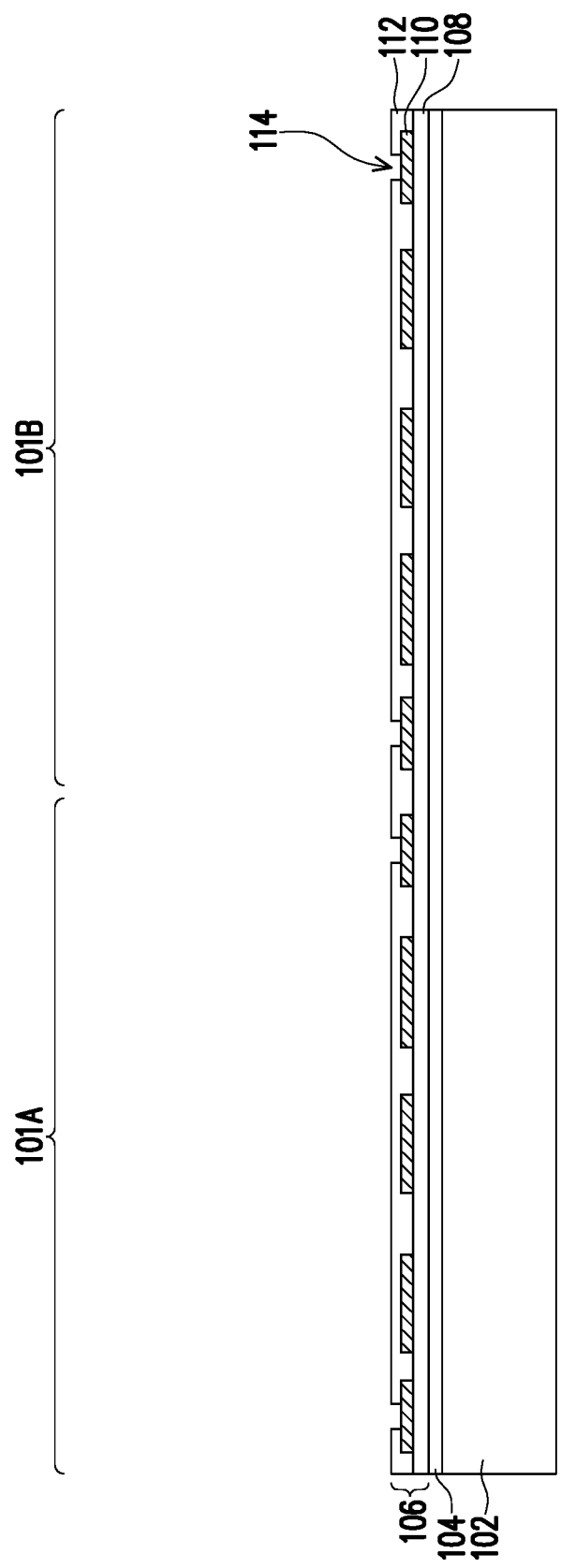

In FIG. 2, a back-side redistribution structure 106 may be formed on the release layer 104. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional. In some embodiments, a dielectric layer without metallization patterns is formed on the release layer 104 in lieu of the back-side redistribution structure 106.

The dielectric layer 108 may be formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride, such as silicon nitride; an oxide, such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof.

The metallization pattern 110 may be formed on the dielectric layer 108. As an example, the metallization pattern 110 may be formed by first forming a seed layer over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal such as copper, titanium, tungsten, aluminum, or the like. The photoresist and portions of the seed layer on which the conductive material is not formed are then removed. The photoresist may be removed by an acceptable ashing or stripping process, such as a process using an oxygen plasma or the like. Once the photoresist is removed, exposed portions of the seed layer are removed using an acceptable etching process, such as wet or dry etching. The remaining portions of the seed layer and the conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, which may be patterned using a lithography mask. In other embodiments, the dielectric layer 112 is formed of a nitride, such as silicon nitride; an oxide, such as silicon oxide, PSG, BSG, BPSG; or the like. The dielectric layer 112 may be formed by spin coating, lamination, CVD, the like, or a combination thereof. The dielectric layer 112 may be patterned to form openings 114 exposing portions of the metallization pattern 110. The patterning may be performed by an acceptable process, such as by exposing the dielectric layer 112 to light when the dielectric layer 112 is a photo-sensitive material or by etching using, for example, an anisotropic etch. In embodiments in which the dielectric layer 112 is a photo-sensitive material, the dielectric layer 112 may be developed after the exposure to light.

It should be appreciated that the back-side redistribution structure 106 may include any number of dielectric layers and metallization patterns. If more dielectric layers and metallization patterns are to be formed, the steps and processes discussed above may be repeated. The metallization patterns may include conductive lines and conductive vias. The conductive vias may be formed during the formation of the metallization patterns by forming the seed layer and the conductive material of the metallization pattern in an opening of the underlying dielectric layer. The conductive vias may interconnect and electrically couple the various conductive lines of the metallization patterns.

Figure 3:
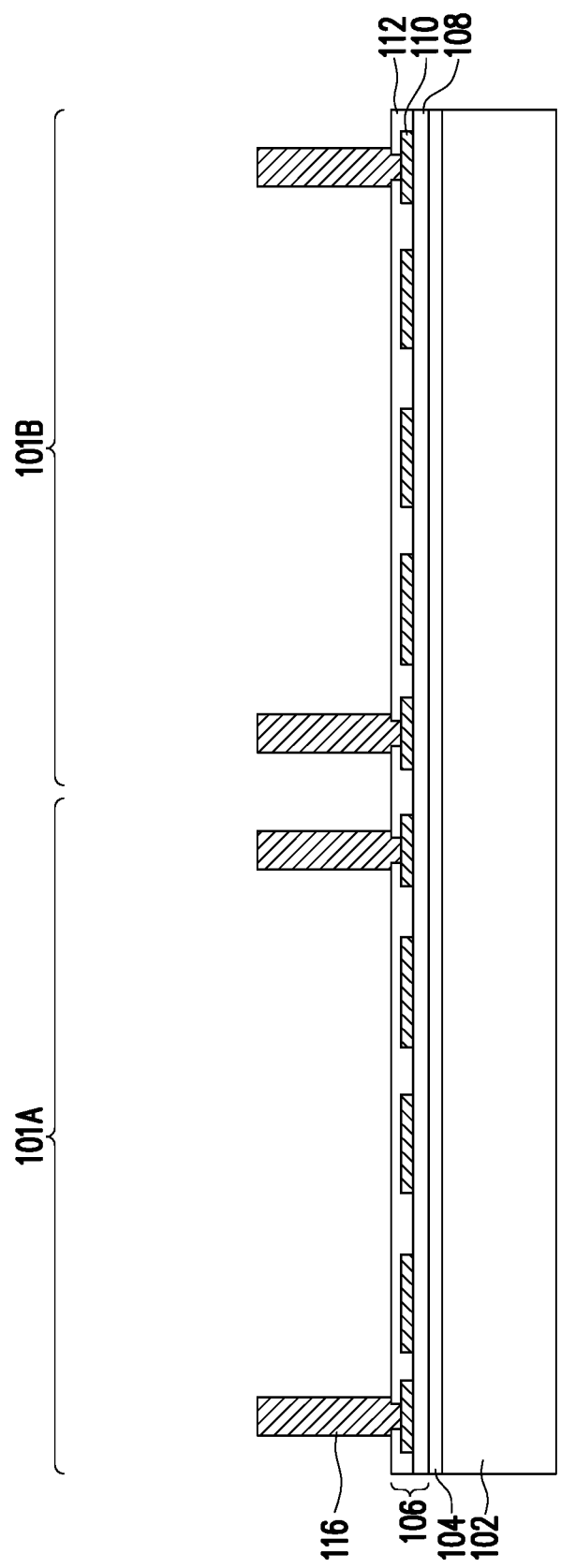

In FIG. 3, through vias 116 are formed in the openings 114 and extending above a topmost dielectric layer of the back-side redistribution structure 106 (e.g., the dielectric layer 112 in the embodiment illustrated in FIG. 3). As an example, the through vias 116 may be formed by first forming a seed layer over the back-side redistribution structure 106, e.g., on the dielectric layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the through vias 116. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as a process using an oxygen plasma or the like. Once the photoresist is removed, exposed portions of the seed layer are removed using an acceptable etching process, such as wet or dry etching. The remaining portions of the seed layer and the conductive material form the through vias 116.

Figure 4:
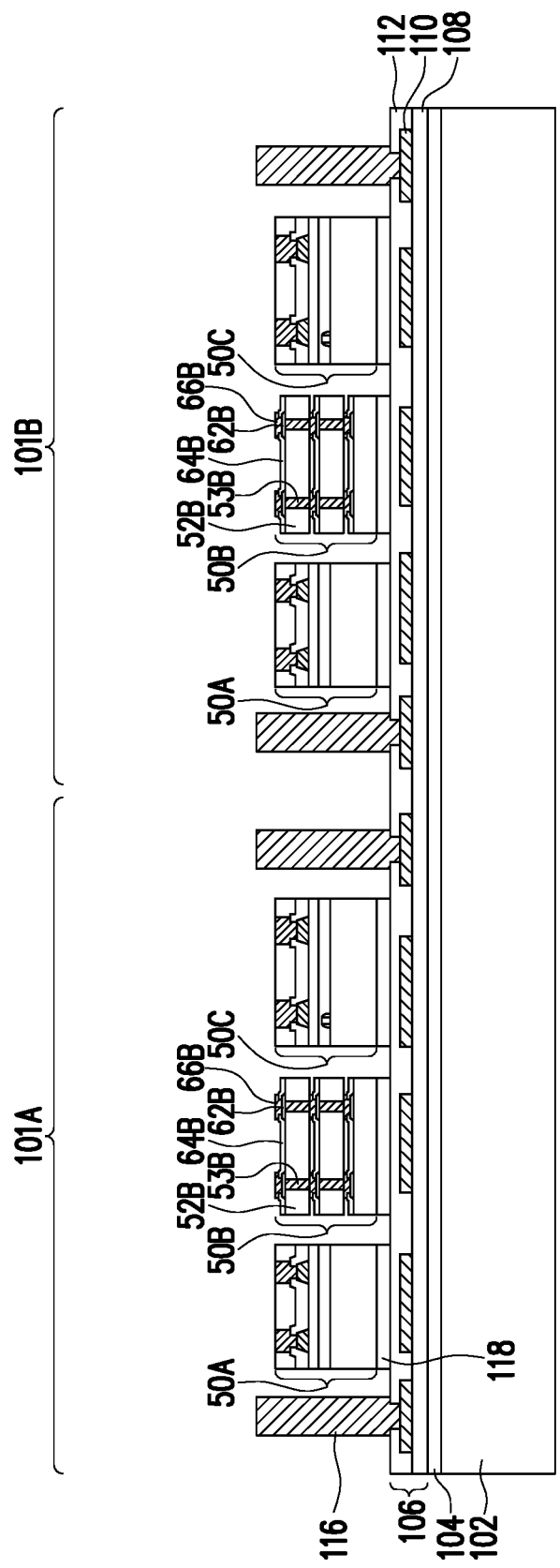

In FIG. 4, dies 50, which include IPDs 50A, discrete passive devices 50B, and active device dies 50C, are adhered to the dielectric layer 112 by an adhesive 118. A desired type and quantity of the dies 50 are adhered in each of the first package region 101A and the second package region 101B. In various embodiments, passive devices, such as the IPDs 50A and the discrete passive devices 50B may occupy an area in each of the first package region 101A and the second package region 101B of greater than 50 percent. In the embodiment illustrated, multiple of the dies 50 are adhered adjacent one another. The IPDs 50A and the active device dies 50C are each described in greater detail below with respect to FIGS. 5A and 5B, respectively.

The discrete passive devices 50B may include, for example, one or more discrete capacitors, inductors, combinations thereof, or the like. When multiple discrete passive devices 50B are disposed in each of the first package region 101A and the second package region 101B, the discrete passive devices 50B may bonded together in a stacked configuration (as illustrated) or disposed side by side directly on the back-side redistribution structure 106. As illustrated in FIG. 4, each of the discrete passive devices 50B may include a semiconductor substrate 52B, through vias 53B extending through the semiconductor substrate 52B, pads 62B disposed over the semiconductor substrate 52B and the through vias 53B, passivation layers 64B disposed on the semiconductor substrate 52B and the pads 62B, and die connectors 66B extending through the passivation layers 64B. The discrete passive devices 50B and the active device dies 50C are optional and, in some embodiments, the discrete passive devices 50B and/or the active device dies 50C may be omitted from the first package region 101A and/or the second package region 101B.

The IPDs 50A, the discrete passive devices 50B, and the active device dies 50C may have different sizes (e.g., different heights and/or surface areas), or may have the same size (e.g., same heights and/or surface areas). The space available for the through vias 116 in the first package region 101A and the second package region 101B may be limited, particularly when the IPDs 50A, the discrete passive devices 50B, and the active device dies 50C include devices with a large footprint, such as SoCs. Use of the back-side redistribution structure 106 allows for an improved interconnect arrangement when the first package region 101A and the second package region 101B have limited space available for the through vias 116.

The adhesive 118 is on back-sides of the IPDs 50A, the discrete passive devices 50B, and the active device dies 50C and adheres the IPDs 50A, the discrete passive devices 50B, and the active device dies 50C to the back-side redistribution structure 106, such as to the dielectric layer 112. The adhesive 118 may be any suitable adhesive, epoxy, die attach film (DAF), or the like. The adhesive 118 may be applied to back-sides of the IPDs 50A, the discrete passive devices 50B, and the active device dies 50C or may be applied over the surface of the dielectric layer 112 on the carrier substrate 102. For example, the adhesive 118 may be applied to the back-sides of the IPDs 50A, the discrete passive devices 50B, and the active device dies 50C before singulating to separate the IPDs 50A, the discrete passive devices 50B, and the active device dies 50C.

Figure 5A:
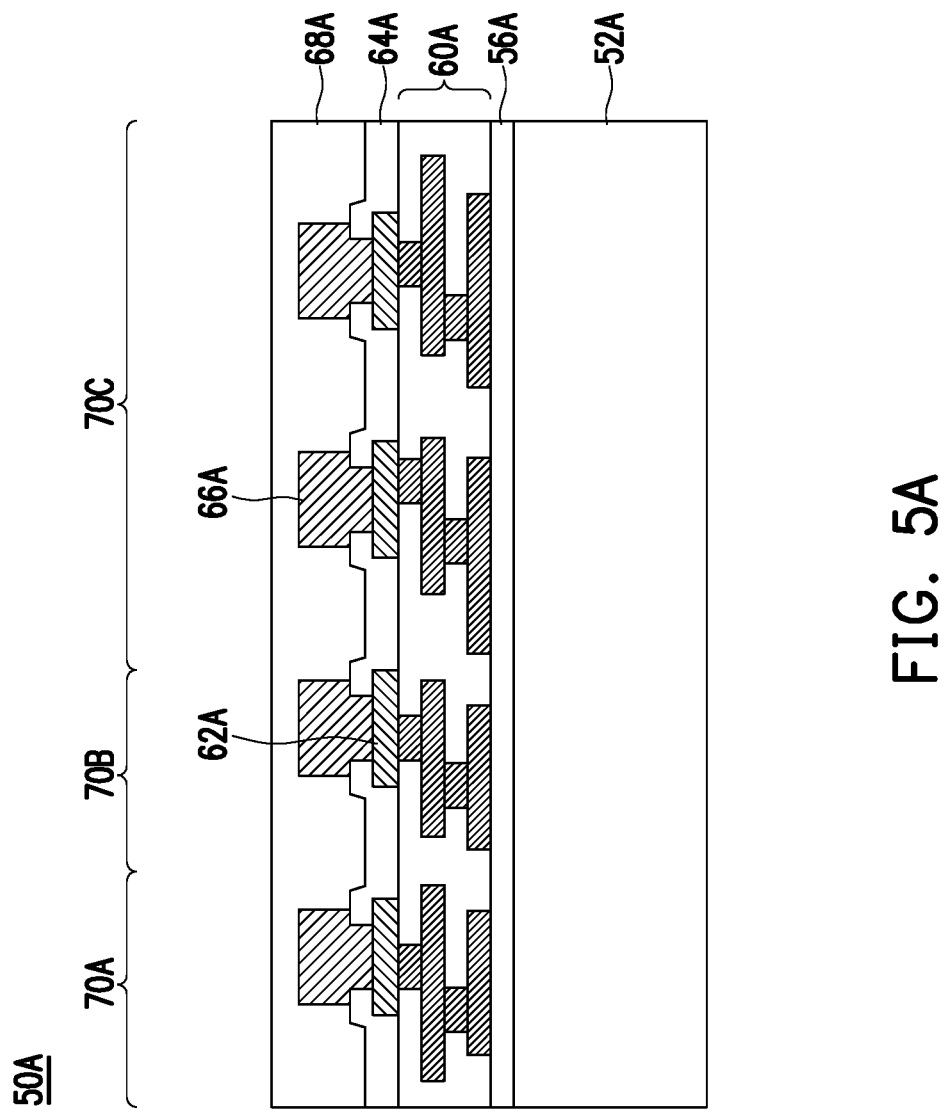

FIG. 5A illustrates an IPD 50A, in accordance with some embodiments. The IPD 50A may include a wide variety of passive devices, such as baluns, couplers, splitters, filters, diplexers, inductors, capacitors, resistors, or the like. In some embodiments, the IPD 50A may be a multi-layer ceramic capacitor (MLCC), a coil inductor, a film resistor, or the like. In accordance with some embodiments, there are no active devices such as transistors or diodes in the IPD 50A.

The IPD 50A may be formed in a wafer, which may include different device regions that are singulated in subsequent steps to form a plurality of the IPDs 50A. The IPD 50A may be processed according to applicable manufacturing processes to form integrated circuits. For example, the IPD 50A may include a semiconductor substrate 52A, such as silicon, doped or undoped, or an active layer of a semiconductor-on-insulator (SOI) substrate. The semiconductor substrate 52A may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52A has an active surface (e.g., the surface facing upwards in FIG. 5A), sometimes called a front-side, and an inactive surface (e.g., the surface facing downwards in FIG. 5A), sometimes called a back-side.

An inter-layer dielectric (ILD) 56A is formed over the front side of the semiconductor substrate 52A. The ILD 56A may include one or more dielectric layers formed of materials such as phosphosilicate glass (PSG), borosilicate glass (BSG), boron-doped phosphosilicate glass (BPSG), undoped silicate glass (USG), or the like.

An interconnect structure 60A is included over the ILD 56A. The interconnect structure 60A may be used to interconnect various passive devices included in the IPD 50A. The interconnect structure 60A may further define the various passive devices included in the IPD 50A. For example, a region 70A of the interconnect structure 60A may define a resistor, a region 70B of the interconnect structure 60A may define a capacitor, and a region 70C of the interconnect structure 60A may define an inductor. However, each of the regions 70A, 70B, and 70C may define any passive devices of the IPD 50A.

The interconnect structure 60A may be formed by, for example, metallization patterns in dielectric layers on the ILDA 56. The metallization patterns include metal lines and vias formed in one or more low-k dielectric layers. The metallization patterns of the interconnect structure 60A are electrically coupled to the passive devices of the IPD 50A.

The IPD 50A further includes pads 62A, such as aluminum pads, to which external connections are made. The pads 62A are on the front side of the IPD 50A, such as in and/or on the interconnect structure 60A. One or more passivation films 64A are on the IPD 50A, such as on portions of the interconnect structure 60A and the pads 62A. Openings extend through the passivation films 64A to the pads 62A. Die connectors 66A, such as conductive pillars (formed of a metal such as copper, for example), extend through the openings in the passivation films 64A and are physically and electrically coupled to respective ones of the pads 62A. The die connectors 66A may be formed by, for example, plating, or the like. The die connectors 66A electrically couple the respective passive devices of the IPD 50A to external devices.

Optionally, solder regions (e.g., solder balls or solder bumps) may be disposed on the pads 62A. The solder balls may be used to perform chip probe (CP) testing on the IPD 50A. The CP testing may be performed on the IPD 50A to ascertain whether the IPD 50A is a known good die (KGD). Thus, only IPDs 50A, which are KGDs, undergo subsequent processing are packaged, and dies, which fail the CP testing, are not packaged. After testing, the solder regions may be removed in subsequent processing steps.

A dielectric layer 68A may be included on the front side of the IPD 50A, such as on the passivation films 64A and the die connectors 66A. The dielectric layer 68A laterally encapsulates the die connectors 66A, and the dielectric layer 68A is laterally coterminous with the IPD 50A. Initially, the dielectric layer 68A may bury the die connectors 66A, such that a topmost surface of the dielectric layer 68A is above topmost surfaces of the die connectors 66A. In some embodiments where solder regions are disposed on the die connectors 66A, the dielectric layer 68A may bury the solder regions as well. Alternatively, the solder regions may be removed prior to forming the dielectric layer 68A.

The dielectric layer 68A may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68A may be formed by, for example, spin coating, lamination, chemical vapor deposition (CVD), or the like. In some embodiments, the die connectors 66A are exposed through the dielectric layer 68A during formation of the IPD 50A. In some embodiments, the die connectors 66A remain buried and are exposed during a subsequent process for packaging the IPD 50A. Exposing the die connectors 66A may remove any solder regions that may be present on the die connectors 66A.

In some embodiments, the IPD 50A may be a stacked device that includes multiple semiconductor substrates 52A. In such embodiments, the IPD 50A includes multiple semiconductor substrates 52A interconnected by through-substrate vias (TSVs). Each of the semiconductor substrates 52A may have an interconnect structure 60A.

Figure 5B:
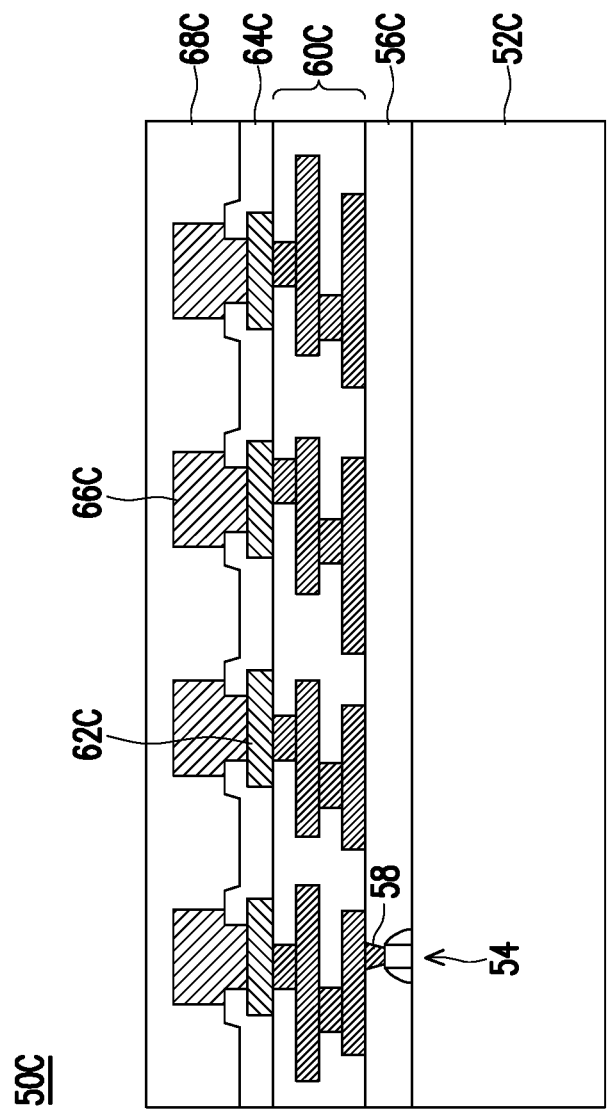

FIG. 5B illustrates an active device die 50C, in accordance with some embodiments. The active device die 50C will be packaged in subsequent processing to form an integrated circuit package. The active device die 50C may be a logic die (e.g., central processing unit (CPU), a graphics processing unit (GPU), a system-on-a-chip (SoC), an application processor (AP), a microcontroller, or the like), a memory die (e.g., a dynamic random access memory (DRAM) die, a static random access memory (SRAM) die, a high bandwidth memory (HBM) die, or the like), an input/output (I/O) interface die, a power management die (e.g., a power management integrated circuit (PMIC) die or the like), a radio frequency (RF) die, a sensor die, a micro-electro-mechanical-system (MEMS) die, a signal processing die (e.g., a digital signal processing (DSP) die or the like), a front-end die (e.g., an analog front-end (AFE) die or the like), the like, or combinations thereof.

The active device die 50C may be formed in a wafer, which may include different device regions that are singulated in subsequent steps to form a plurality of active device dies. The active device die 50C may be processed according to applicable manufacturing processes to form integrated circuits. For example, the active device die 50C includes a semiconductor substrate 52C, such as silicon, doped or undoped, or an active layer of a semiconductor-on-insulator (SOI) substrate. The semiconductor substrate 52C may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52C has an active surface (e.g., the surface facing upwards in FIG. 5B), sometimes called a front-side, and an inactive surface (e.g., the surface facing downwards in FIG. 5B), sometimes called a backside.

Devices 54 may be formed at the front side of the semiconductor substrate 52. The devices 54 may be active devices (e.g., transistors, diodes, or the like), capacitors, resistors, or the like. An inter-layer dielectric (ILD) 56C is formed over the front side of the semiconductor substrate 52C. The ILD 56C surrounds and may cover the devices 54. The ILD 56C may include one or more dielectric layers formed of materials such as phosphosilicate glass (PSG), borosilicate glass (BSG), boron-doped phosphosilicate glass (BPSG), undoped silicate glass (USG), or the like.

Conductive plugs 58 extend through the ILD 56C to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60C is included over the ILD 56C and the conductive plugs 58. The interconnect structure 60C interconnects the devices 54 to form an integrated circuit. The interconnect structure 60C may be formed by, for example, metallization patterns in dielectric layers on the ILD 56C. The metallization patterns include metal lines and vias formed in one or more low-k dielectric layers. The metallization patterns of the interconnect structure 60C are electrically coupled to the devices 54 by the conductive plugs 58.

The active device die 50C further includes pads 62C, such as aluminum pads, to which external connections are made. The pads 62C are on the active side of the active device die 50C, such as in and/or on the interconnect structure 60C. One or more passivation films 64C are on the active device die 50C, such as on portions of the interconnect structure 60C and the pads 62C. Openings extend through the passivation films 64C to the pads 62C. Die connectors 66C, such as conductive pillars (formed of a metal such as copper, for example), extend through the openings in the passivation films 64C and are physically and electrically coupled to respective ones of the pads 62C. The die connectors 66C may be formed by, for example, plating, or the like. The die connectors 66C electrically couple the respective integrated circuits of the active device die 50C.

Optionally, solder regions (e.g., solder balls or solder bumps) may be disposed on the pads 62C. The solder balls may be used to perform chip probe (CP) testing on the active device die 50C. The CP testing may be performed on the active device die 50C to ascertain whether the active device die 50C is a known good die (KGD). Thus, only active device dies 50C, which are KGDs, undergo subsequent processing are packaged, and dies, which fail the CP testing, are not packaged. After testing, the solder regions may be removed in subsequent processing steps.

A dielectric layer 68C may be on the front side of the active device die 50C, such as on the passivation films 64C and the die connectors 66C. The dielectric layer 68C laterally encapsulates the die connectors 66C, and the dielectric layer 68C is laterally coterminous with the active device die 50C. Initially, the dielectric layer 68C may bury the die connectors 66C, such that a topmost surface of the dielectric layer 68C is above topmost surfaces of the die connectors 66C. In some embodiments where solder regions are disposed on the die connectors 66C, the dielectric layer 68C may bury the solder regions as well. Alternatively, the solder regions may be removed prior to forming the dielectric layer 68C.

The dielectric layer 68C may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68C may be formed, for example, by spin coating, lamination, CVD, or the like. In some embodiments, the die connectors 66C are exposed through the dielectric layer 68C during formation of the active device die 50C. In some embodiments, the die connectors 66C remain buried and are exposed during a subsequent process for packaging the active device die 50C. Exposing the die connectors 66C may remove any solder regions that may be present on the die connectors 66C.

In some embodiments, the active device die 50C is a stacked device that includes multiple semiconductor substrates 52C. For example, the active device die 50C may be a memory device such as a hybrid memory cube (HMC) module, a high bandwidth memory (HBM) module, or the like that includes multiple memory dies. In such embodiments, the active device die 50C includes multiple semiconductor substrates 52C interconnected by through-substrate vias (TSVs). Each of the semiconductor substrates 52C may have an interconnect structure 60C.

Figure 6:
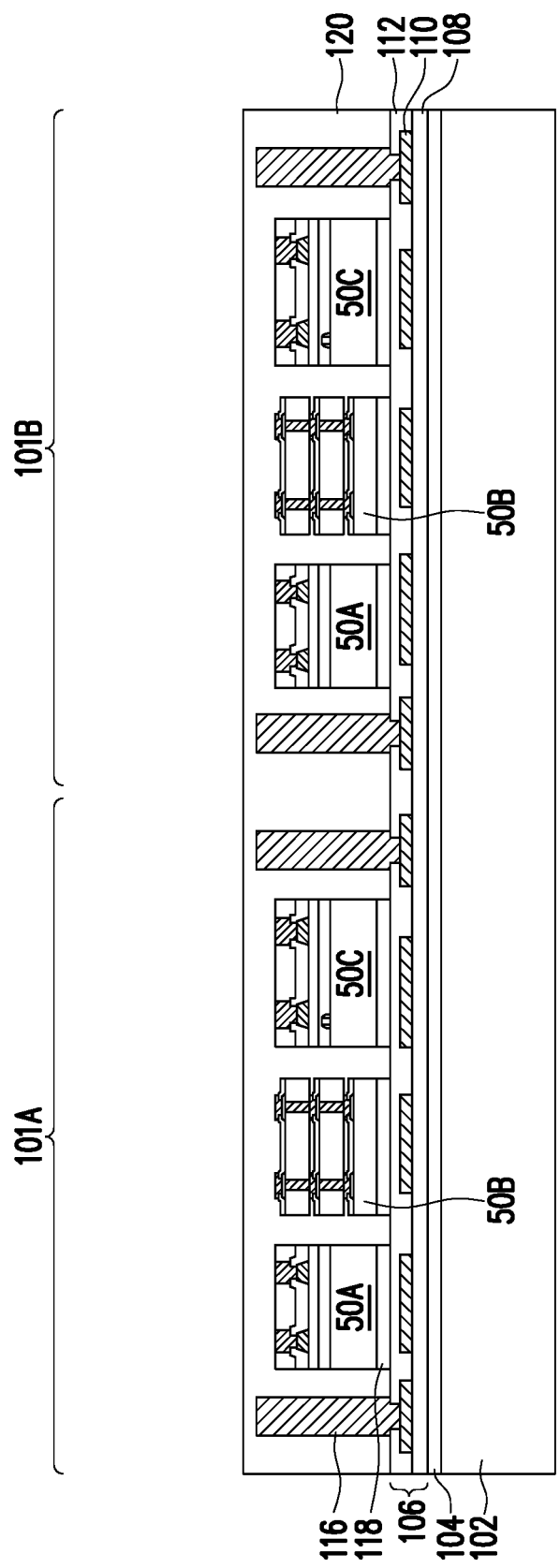

In FIG. 6, an encapsulant 120 is formed on and around the dies 50 and the through vias 116. After formation, the encapsulant 120 encapsulates the through vias 116, the IPDs 50A, the discrete passive devices 50B, and the active device dies 50C. The encapsulant 120 may be a molding compound, epoxy, or the like. The encapsulant 120 may be applied by compression molding, transfer molding, or the like, and may be formed over the carrier substrate 102 such that the through vias 116 and/or the IPDs 50A, the discrete passive devices 50B, and the active device dies 50C are buried or covered. The encapsulant 120 is further formed in gap regions between the IPDs 50A, the discrete passive devices 50B, and the active device dies 50C. The encapsulant 120 may be applied in liquid or semi-liquid form and subsequently cured.

Figure 7:
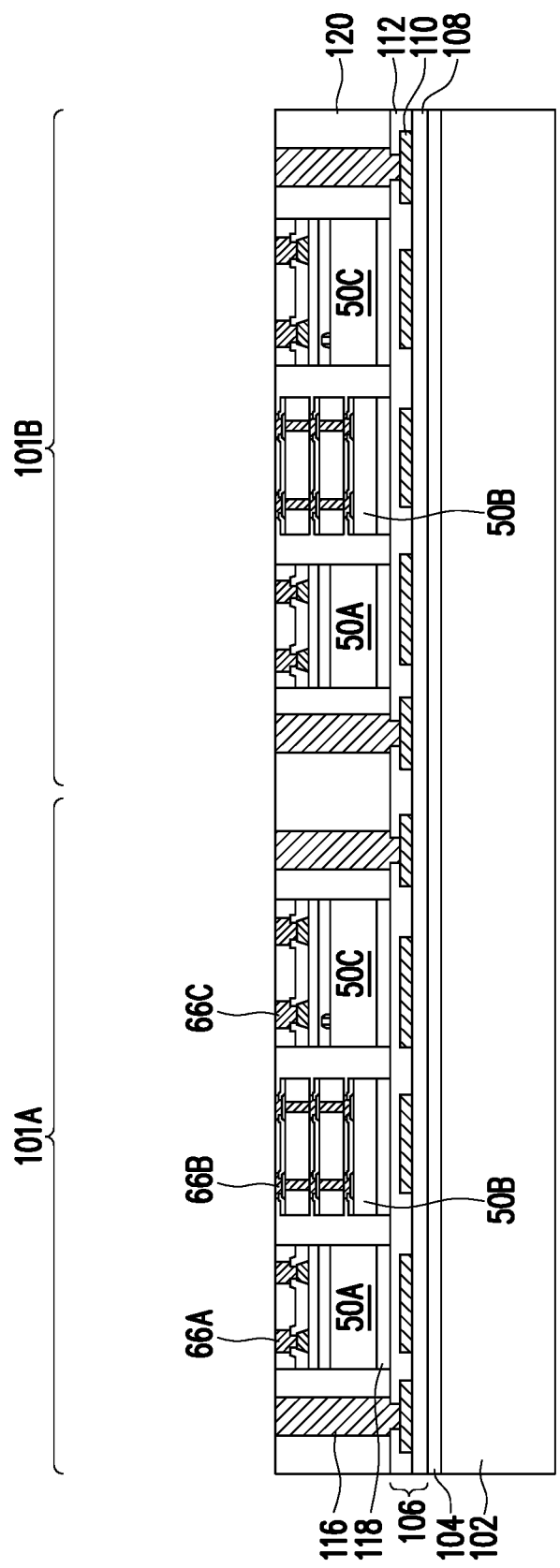

In FIG. 7, a planarization process is performed on the encapsulant 120 to expose the through vias 116 and the die connectors 66A, 66B, and 66C. The planarization process may also remove material of the through vias 116, the dielectric layers 68A and 68C, and/or the die connectors 66A, 66B, and 66C until the die connectors 66A, 66B, and 66C and the through vias 116 are exposed. Following the planarization process, top surfaces of the through vias 116, the die connectors 66A, 66B, and 66C, the dielectric layers 68A and 68C, and the encapsulant 120 may be level with one another (e.g., coplanar). The planarization process may be, for example, a chemical-mechanical polish (CMP) process, a grinding process, an etch-back process, or the like. In some embodiments, the planarization process may be omitted, for example, if the through vias 116 and/or die connectors 66A, 66B, and 66C are already exposed.

In FIGS. 8 through 11, a front-side redistribution structure 122 (see FIG. 11) is formed over the encapsulant 120, the through vias 116, the IPDs 50A, the discrete passive devices 50B, and the active device dies 50C. The front-side redistribution structure 122 includes dielectric layers 124, 128, 132, and 136; and metallization patterns 126, 130, and 134. The metallization patterns may also be referred to as redistribution layers or redistribution lines. The front-side redistribution structure 122 illustrated in FIG. 11 includes three layers of metallization patterns and four layers of dielectric layers; however, more or fewer metallization patterns and dielectric layers may be included in the front-side redistribution structure 122. If fewer dielectric layers and metallization patterns are to be formed, steps and process discussed below may be omitted. If more dielectric layers and metallization patterns are to be formed, steps and processes discussed below may be repeated.

Figure 8:
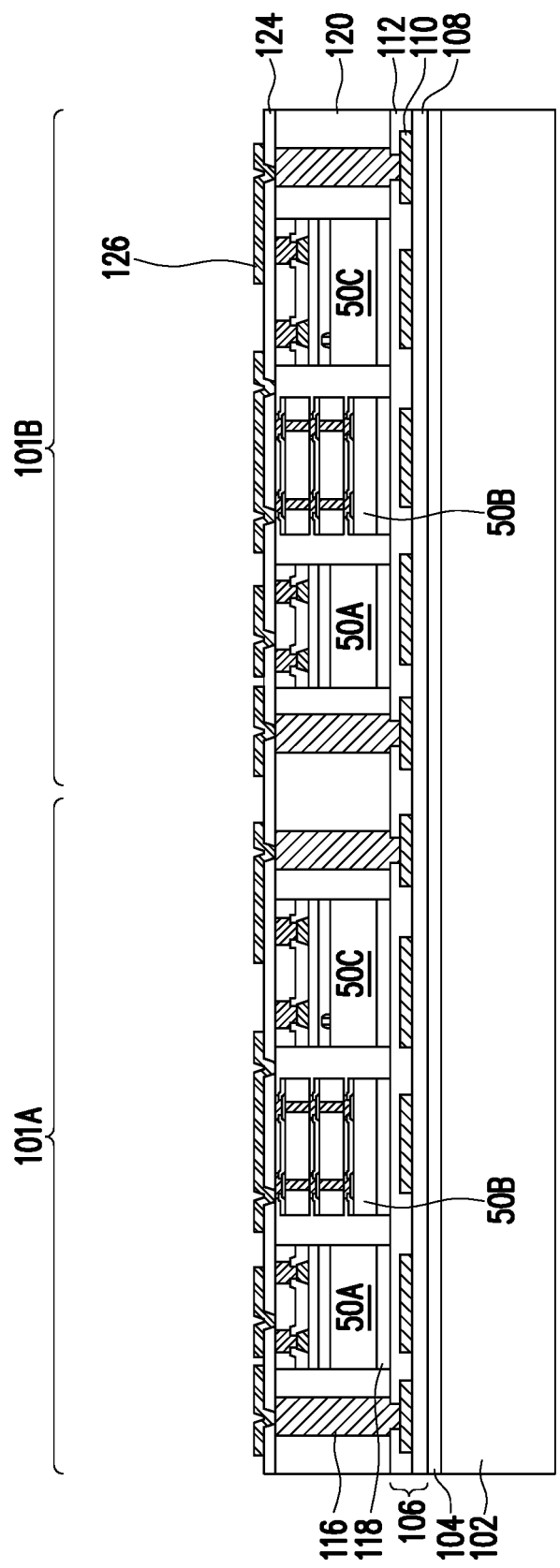

In FIG. 8, the dielectric layer 124 is deposited on the encapsulant 120, the through vias 116, and the die connectors 66A, 66B, and 66C. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings exposing portions of the through vias 116 and the die connectors 66A, 66B, and 66C. The patterning may be by an acceptable process, such as by exposing the dielectric layer 124 to light when the dielectric layer 124 is a photo-sensitive material or by etching using, for example, an anisotropic etch. If the dielectric layer 124 is a photo-sensitive material, the dielectric layer 124 may be developed after the exposure.

The metallization pattern 126 is then formed. The metallization pattern 126 includes line portions (also referred to as conductive lines) on and extending along the major surface of the dielectric layer 124. The metallization pattern 126 further includes via portions (also referred to as conductive vias) extending through the dielectric layer 124 to physically and electrically couple the through vias 116 and the IPDs 50A, the discrete passive devices 50B, and the active device dies 50C. As an example, the metallization pattern 126 may be formed by first forming a seed layer over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching.

Figure 9:
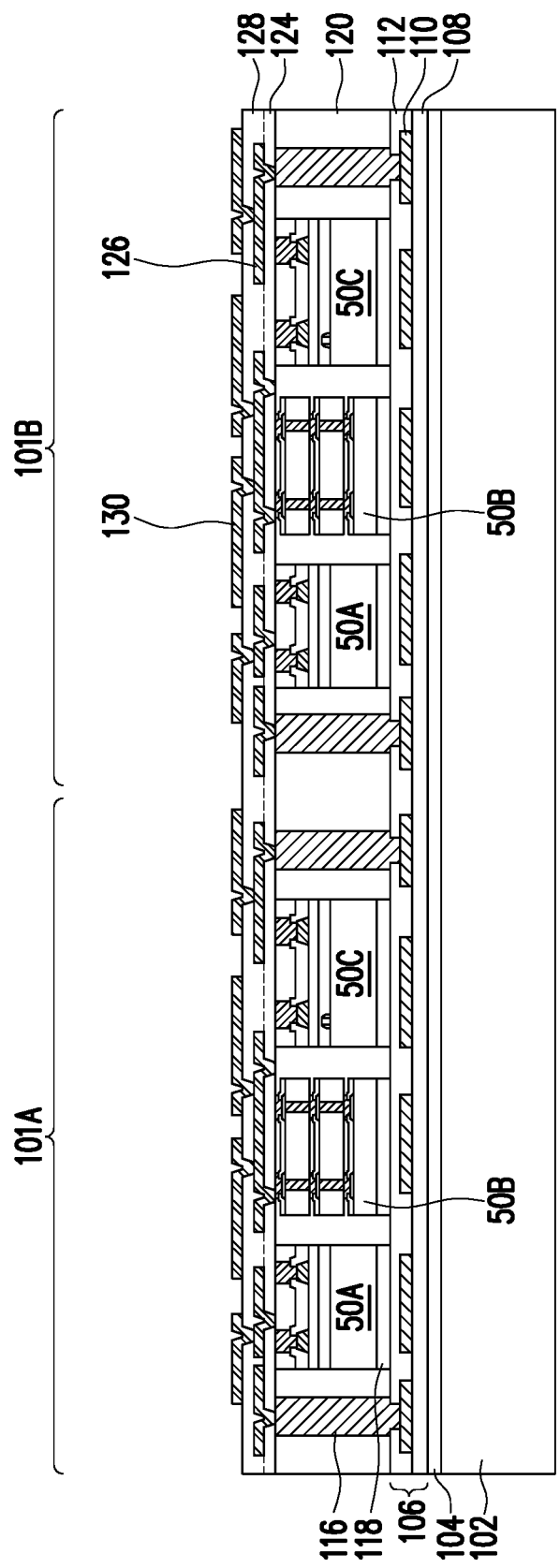

In FIG. 9, the dielectric layer 128 is deposited on the metallization pattern 126 and dielectric layer 124. The dielectric layer 128 may be formed in a manner similar to the dielectric layer 124, and may be formed of a material similar to the material of the dielectric layer 124.

The metallization pattern 130 is then formed. The metallization pattern 130 includes line portions on and extending along the major surface of the dielectric layer 128. The metallization pattern 130 further includes via portions extending through the dielectric layer 128 to physically and electrically couple the metallization pattern 126. The metallization pattern 130 may be formed in a manner similar to the metallization pattern 126, and may be formed of a material similar to the material of the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

Figure 10:
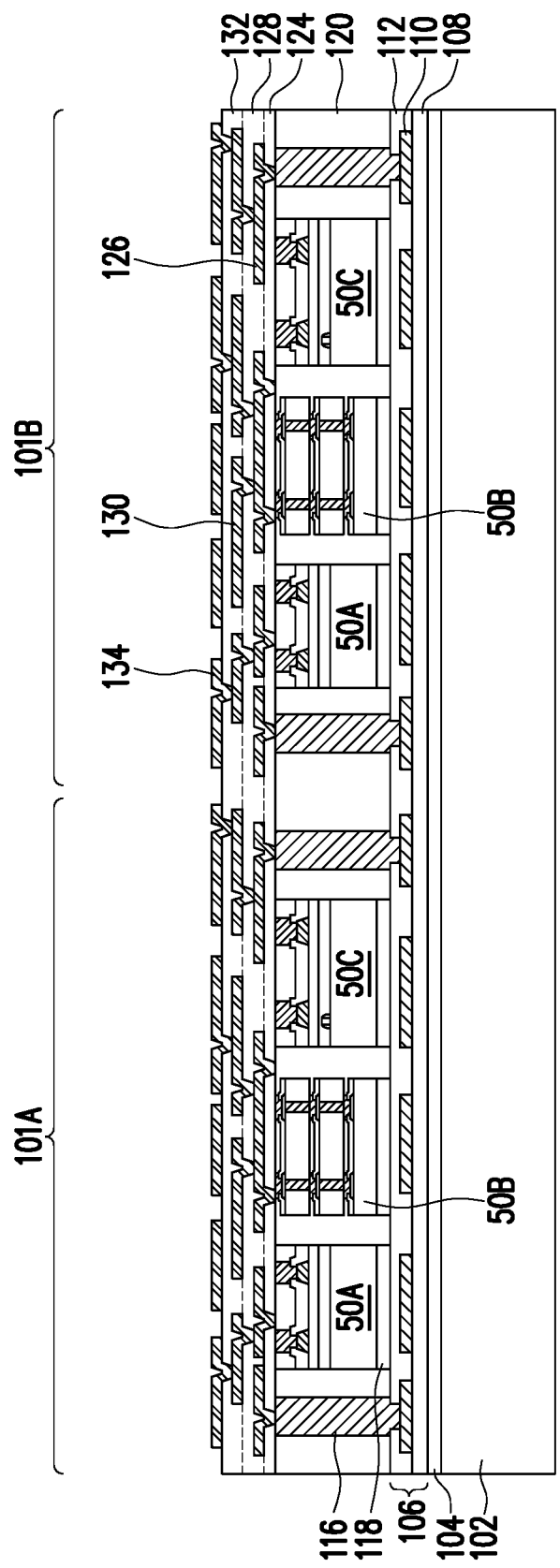

In FIG. 10, the dielectric layer 132 is deposited on the metallization pattern 130 and dielectric layer 128. The dielectric layer 132 may be formed in a manner similar to the dielectric layer 124, and may be formed of a material similar to the material of the dielectric layer 124.

The metallization pattern 134 is then formed. The metallization pattern 134 includes line portions on and extending along the major surface of the dielectric layer 132. The metallization pattern 134 further includes via portions extending through the dielectric layer 132 to physically and electrically couple the metallization pattern 130. The metallization pattern 134 may be formed in a manner similar to the metallization pattern 126, and may be formed of a material similar to the material of the metallization pattern 126. The metallization pattern 134 is the topmost metallization pattern of the front-side redistribution structure 122. As such, all of the intermediate metallization patterns of the front-side redistribution structure 122 (e.g., the metallization patterns 126 and 130) are disposed between the metallization pattern 134 and the IPDs 50A, the discrete passive devices 50B, and the active device dies 50C. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

Figure 11:
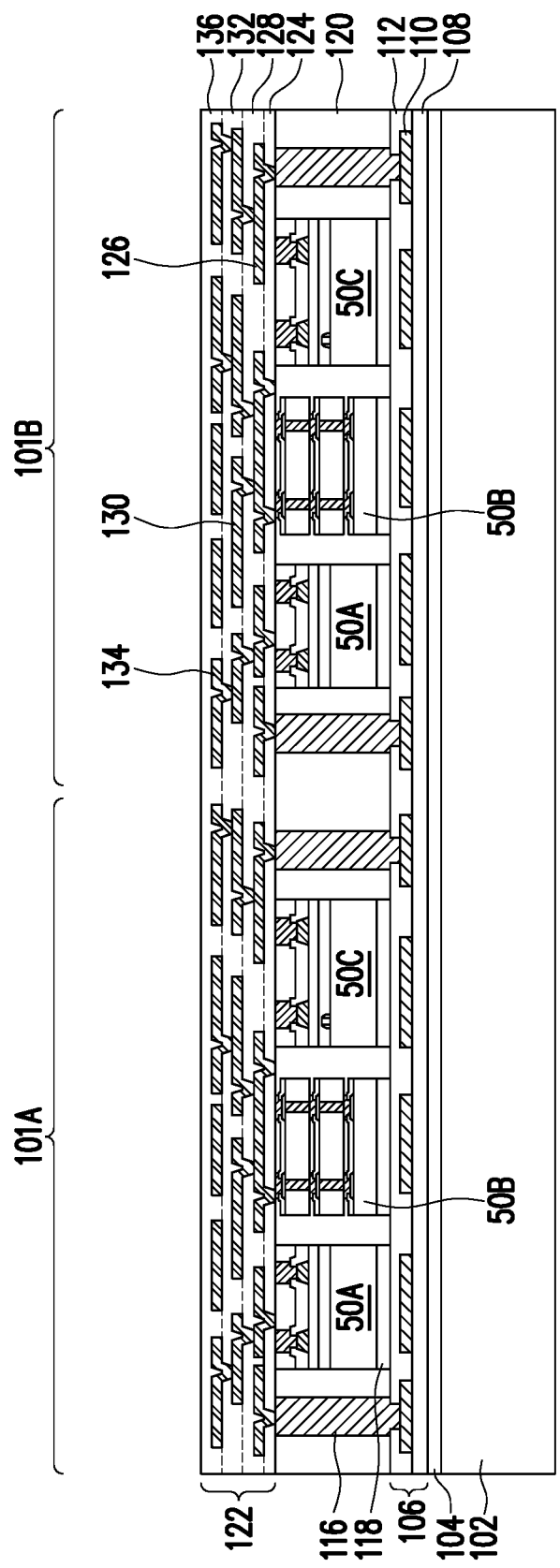

In FIG. 11, the dielectric layer 136 is deposited on the metallization pattern 134 and dielectric layer 132. The dielectric layer 136 may be formed in a manner similar to the dielectric layer 124, and may be formed of a material similar to the material of the dielectric layer 124. The dielectric layer 136 is the topmost dielectric layer of the front-side redistribution structure 122. As such, all of the metallization patterns of the front-side redistribution structure 122 (e.g., the metallization patterns 126, 130, and 134) are disposed between the dielectric layer 136 and the IPDs 50A, the discrete passive devices 50B, and the active device dies 50C. Further, all of the intermediate dielectric layers of the front-side redistribution structure 122 (e.g., the dielectric layers 124, 128, 132) are disposed between the dielectric layer 136 and the IPDs 50A, the discrete passive devices 50B, and the active device dies 50C.

Figure 12:
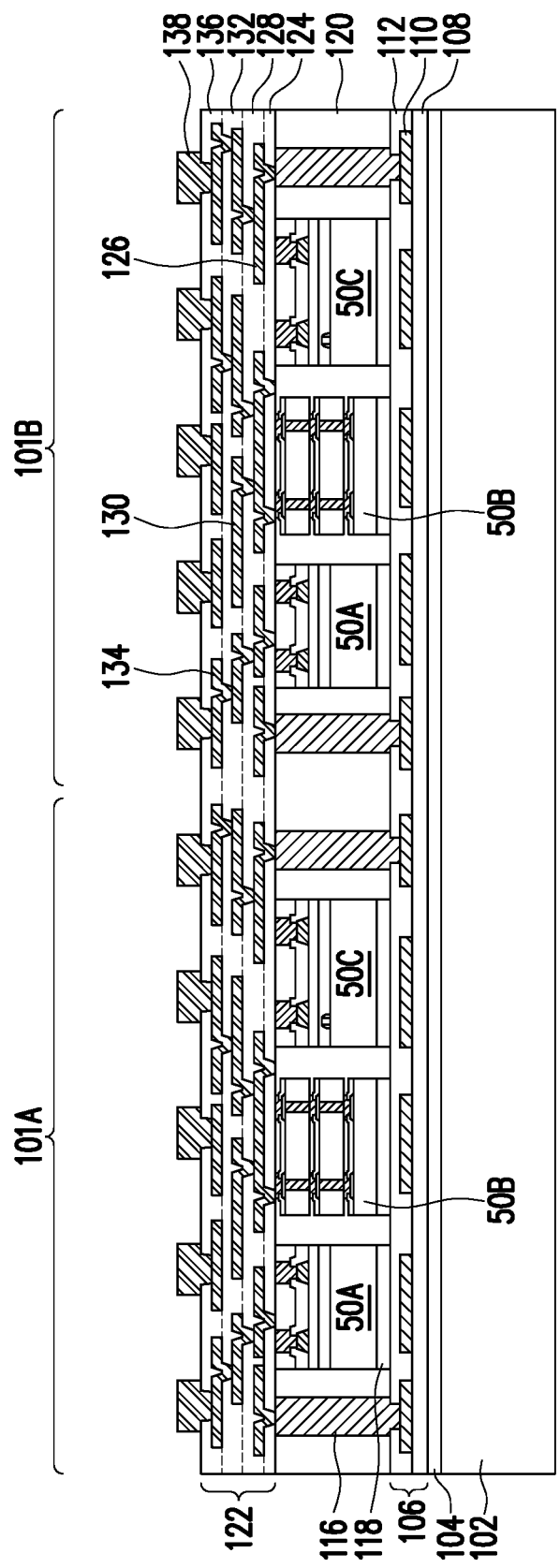

In FIG. 12, UBMs 138 are formed for external connection to the front-side redistribution structure 122. The UBMs 138 have bump portions on and extending along a major surface of the dielectric layer 136, and have via portions extending through the dielectric layer 136 to physically and electrically couple to the metallization pattern 134. As a result, the UBMs 138 are electrically coupled to the through vias 116 and the IPDs 50A, the discrete passive devices 50B, and the active device dies 50C. The UBMs 138 may be formed of the same material as the metallization pattern 126. In some embodiments, the UBMs 138 may have different sizes from the metallization patterns 126, 130, and 134.

Figure 13:
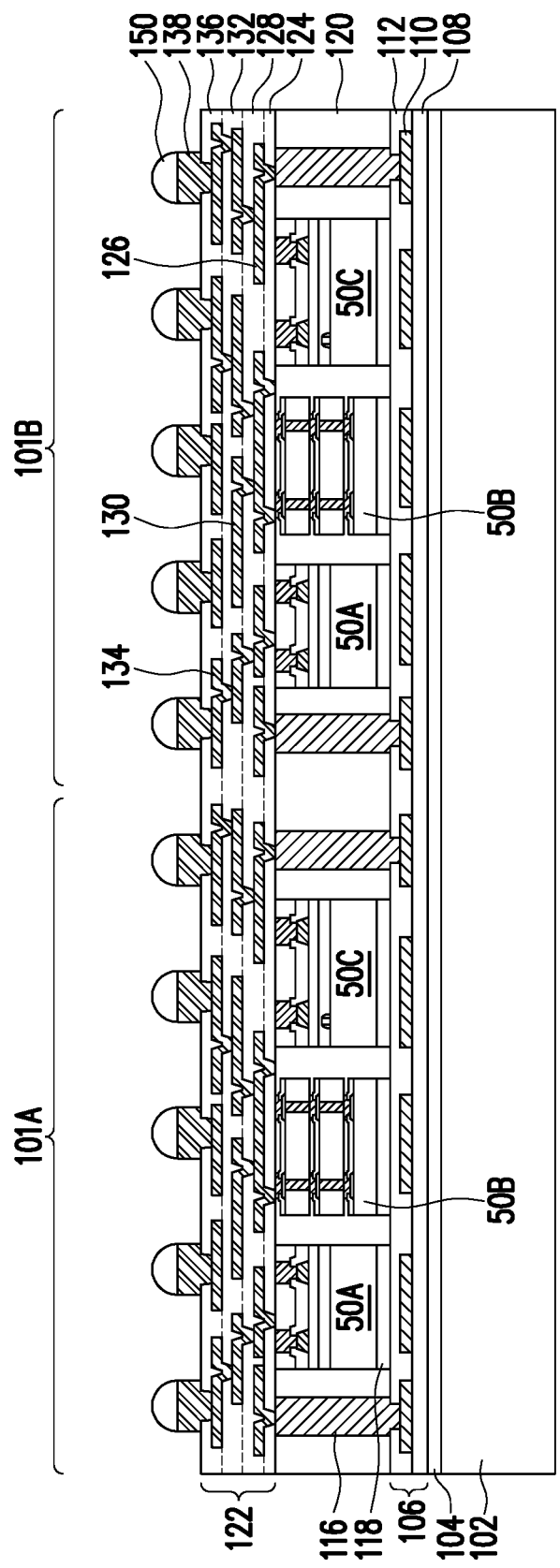

In FIG. 13, conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 14:
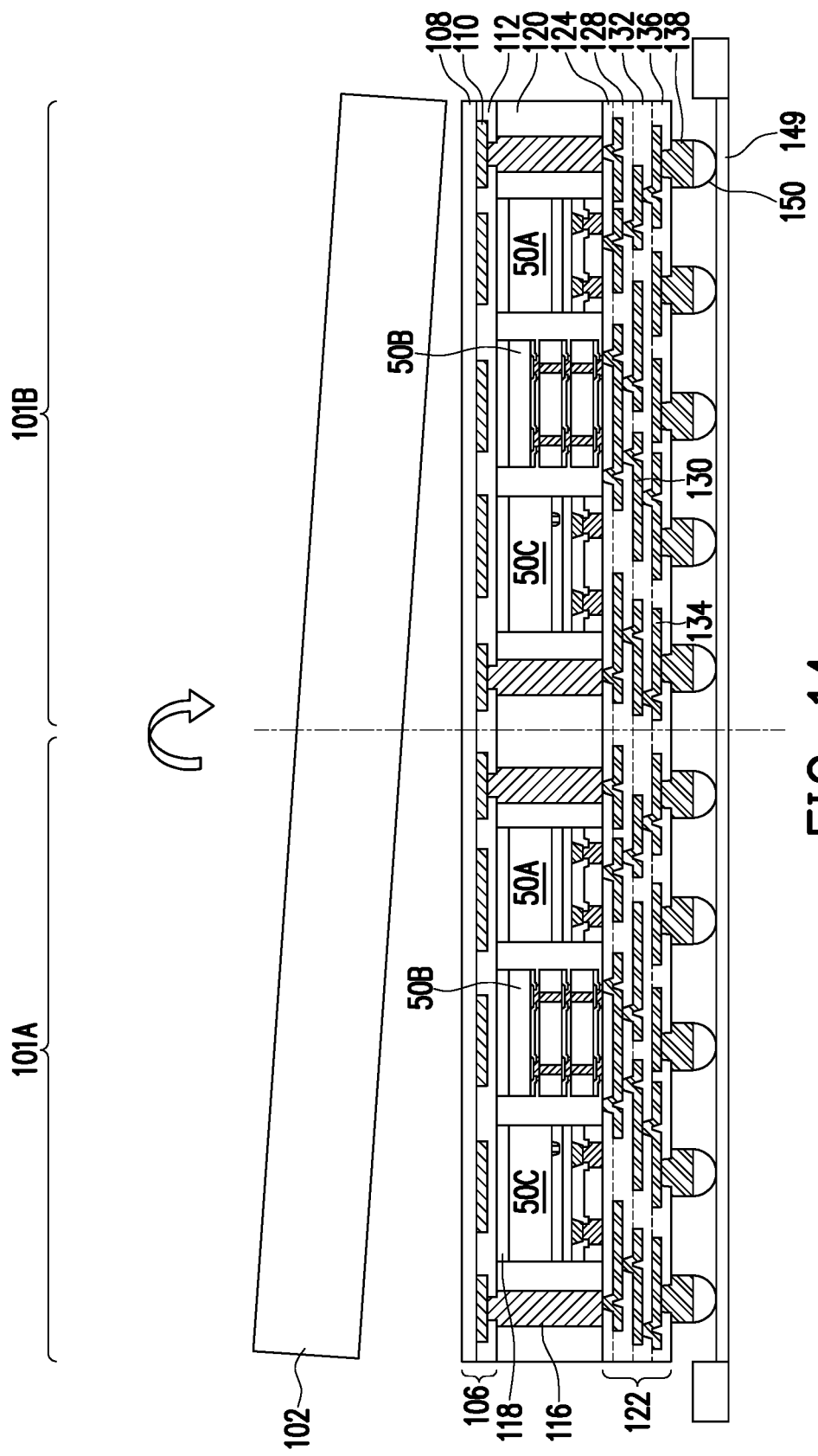

In FIG. 14, the structure of FIG. 13 is flipped, placed on tape 149, and the carrier substrate 102 is de-bonded from the back-side redistribution structure 106, e.g., the dielectric layer 108. In accordance with some embodiments, the de-bonding includes projecting a light such as a laser light or a UV light on the release layer 104 so that the release layer 104 decomposes under the heat of the light and the carrier substrate 102 can be removed. The structure is then flipped over and placed on the tape 149.

Further in FIG. 14, the front-side redistribution structure 122 may be pre-cut. A cutting apparatus may partially cut into the front-side redistribution structure 122 in a scribe line area between the first package region 101A and the second package region 101B to form recesses (not separately illustrated) in the front-side redistribution structure 122. In some embodiments, the cutting apparatus for the pre-cut process is a laser. The pre-cut process may prevent delamination of the front-side redistribution structure 122 and its layers during the subsequent singulation process (see, e.g., FIGS. 16A-16C).

Figure 15:
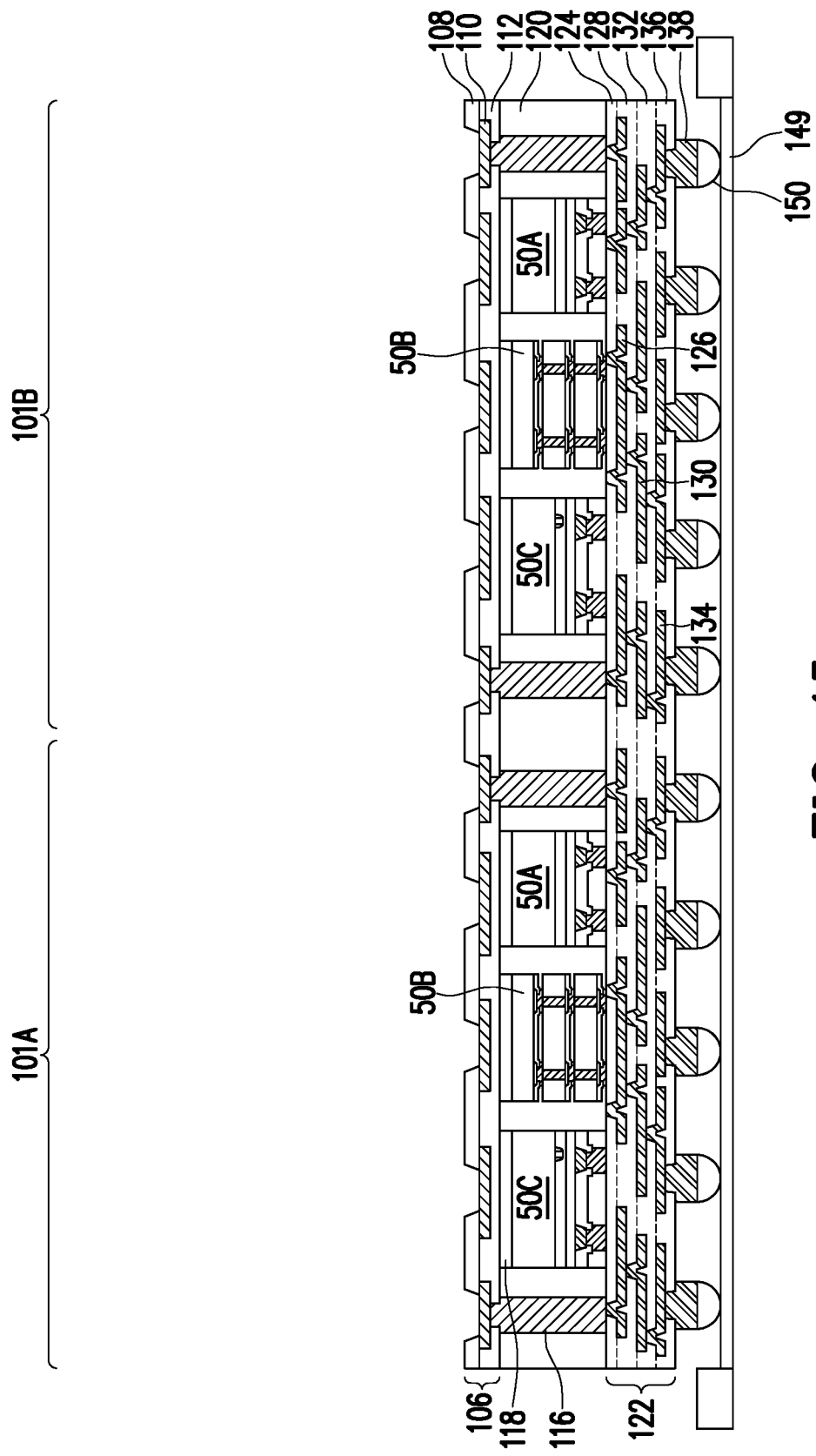

In FIG. 15, openings 151 are formed through the dielectric layer 108 to expose portions of the metallization pattern 110. The openings 151 may be formed, for example, using laser drilling, etching, or the like.

Figure 16A:
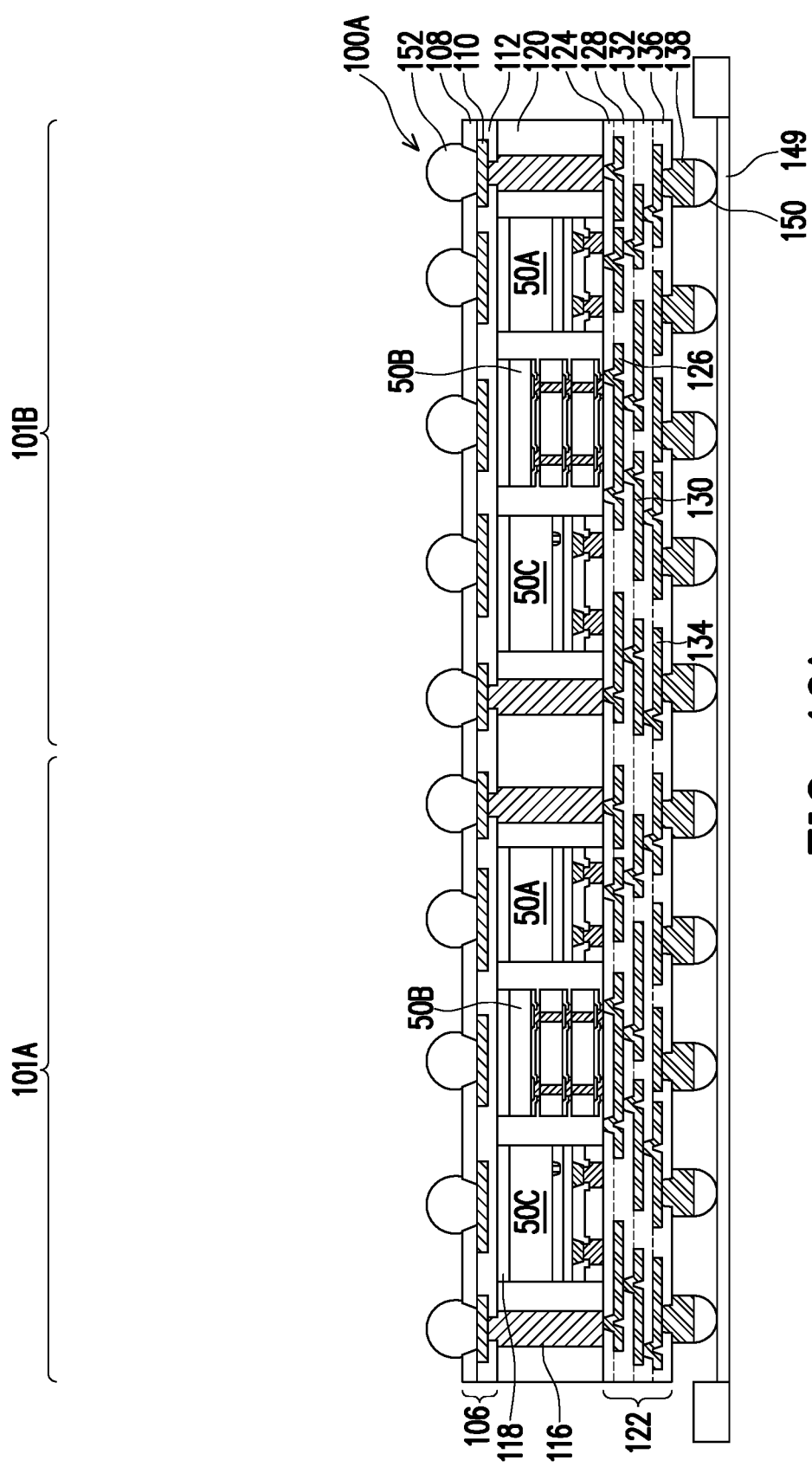
Figure 16B:
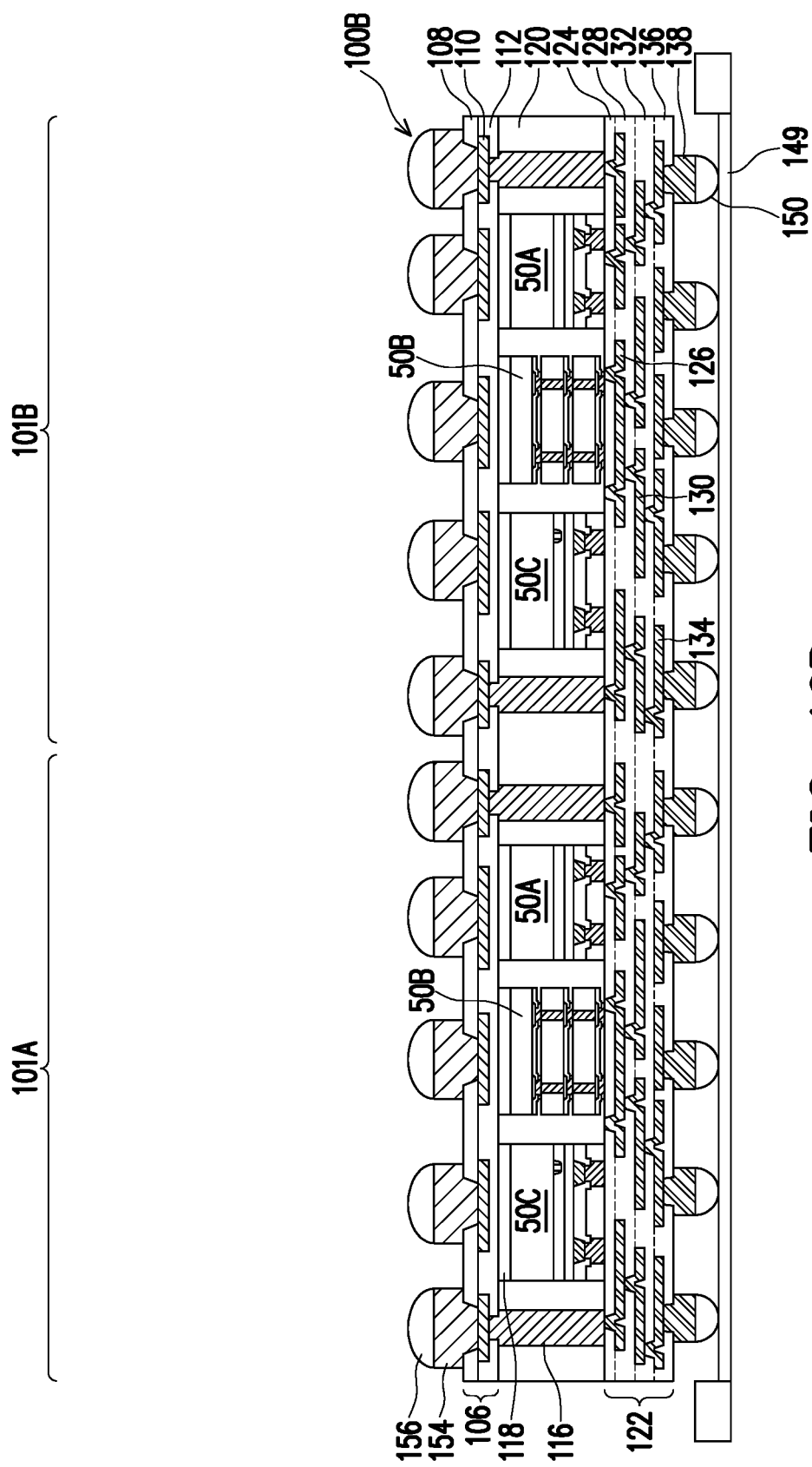
Figure 16C:
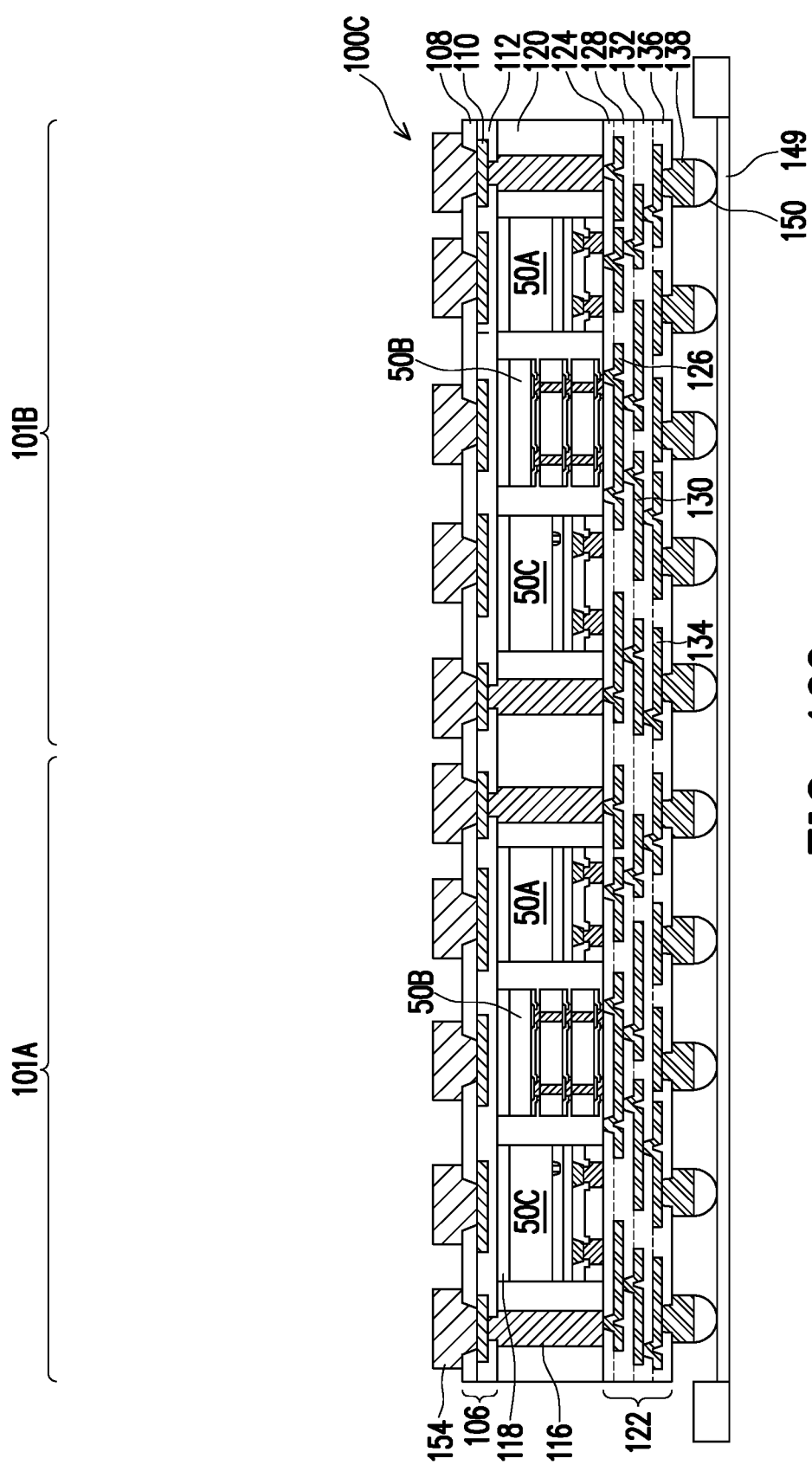

In FIGS. 16A-16C, various external connectors are formed in the openings 151 to form first package components 100 in the first package region 101A and the second package region 101B. In FIG. 16A, conductive connectors 152 are formed on the metallization pattern 110 in the openings 151, forming first package components 100A in the first package region 101A and the second package region 101B. The conductive connectors 152 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 152 may include a conductive material such as solder, copper, aluminum, gold, nickel, silver, palladium, tin, the like, or a combination thereof. In some embodiments, the conductive connectors 152 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

In FIG. 16B, pads 154 are formed on the metallization pattern 110 in the openings 151, forming first package components 100B in the first package region 101A and the second package region 101B. The pads 154 are used to couple to conductive connectors 156 and may be referred to as under bump metallurgies (UBMs) 154. In the illustrated embodiment, the pads 154 are formed in the openings 151 through the dielectric layer 108 through to the metallization pattern 110.

As an example, the pads 154 may be formed by first forming a seed layer over the dielectric layer 108 and in the openings 151 extending through the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the pads 154. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. In some embodiments, the pads 154 may comprise alloys such as electroless nickel, electroless palladium, immersion gold (ENEPIG), electroless nickel, immersion gold (ENIG), or the like. The combination of the conductive material and underlying portions of the seed layer form the pads 154. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching.

Next, the conductive connectors 156 are formed over the pads 154. The conductive connectors 156 may be formed in a manner similar to the conductive connectors 152, and may be formed of a material similar to the material of the conductive connectors 152.

FIG. 16C illustrates an embodiment in which the pads 154 are formed without conductive connectors being formed over the pads 154, forming first package components 100C in the first package region 101A and the second package region 101B. The pads 154 may be formed in of a material and in a manner similar to those discussed with reference to FIG. 16B.

Figure 17A:
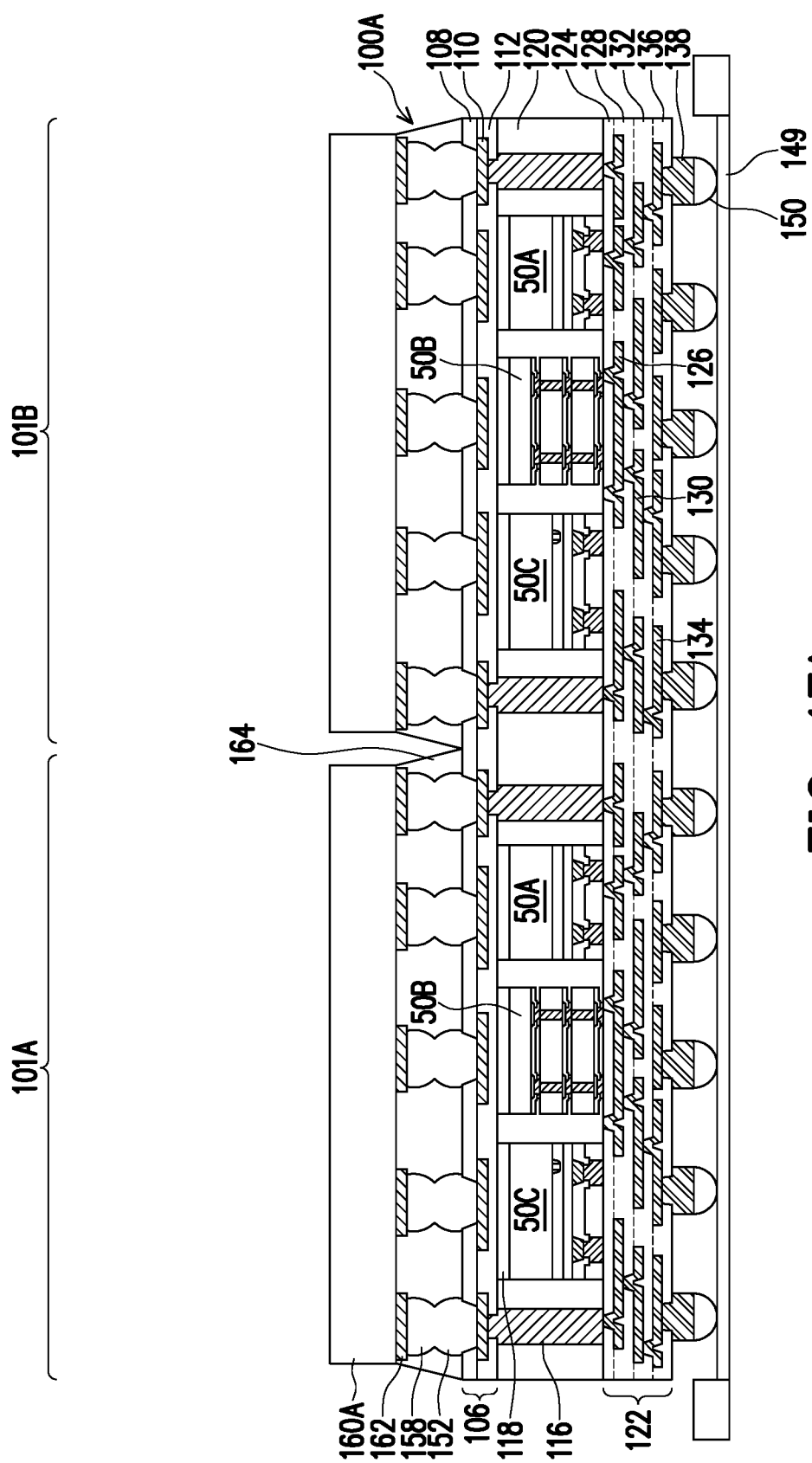
Figure 17B:
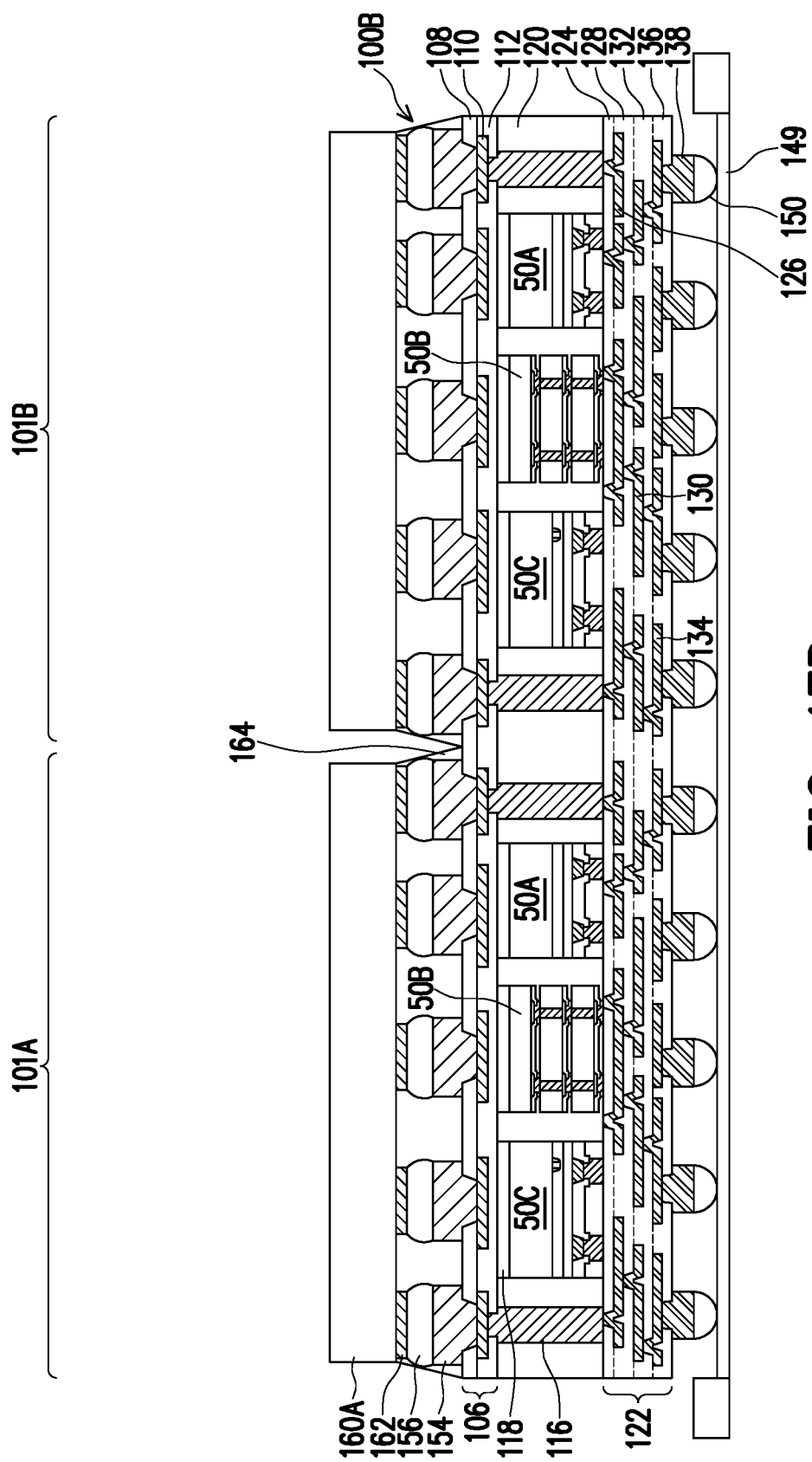
Figure 17C:
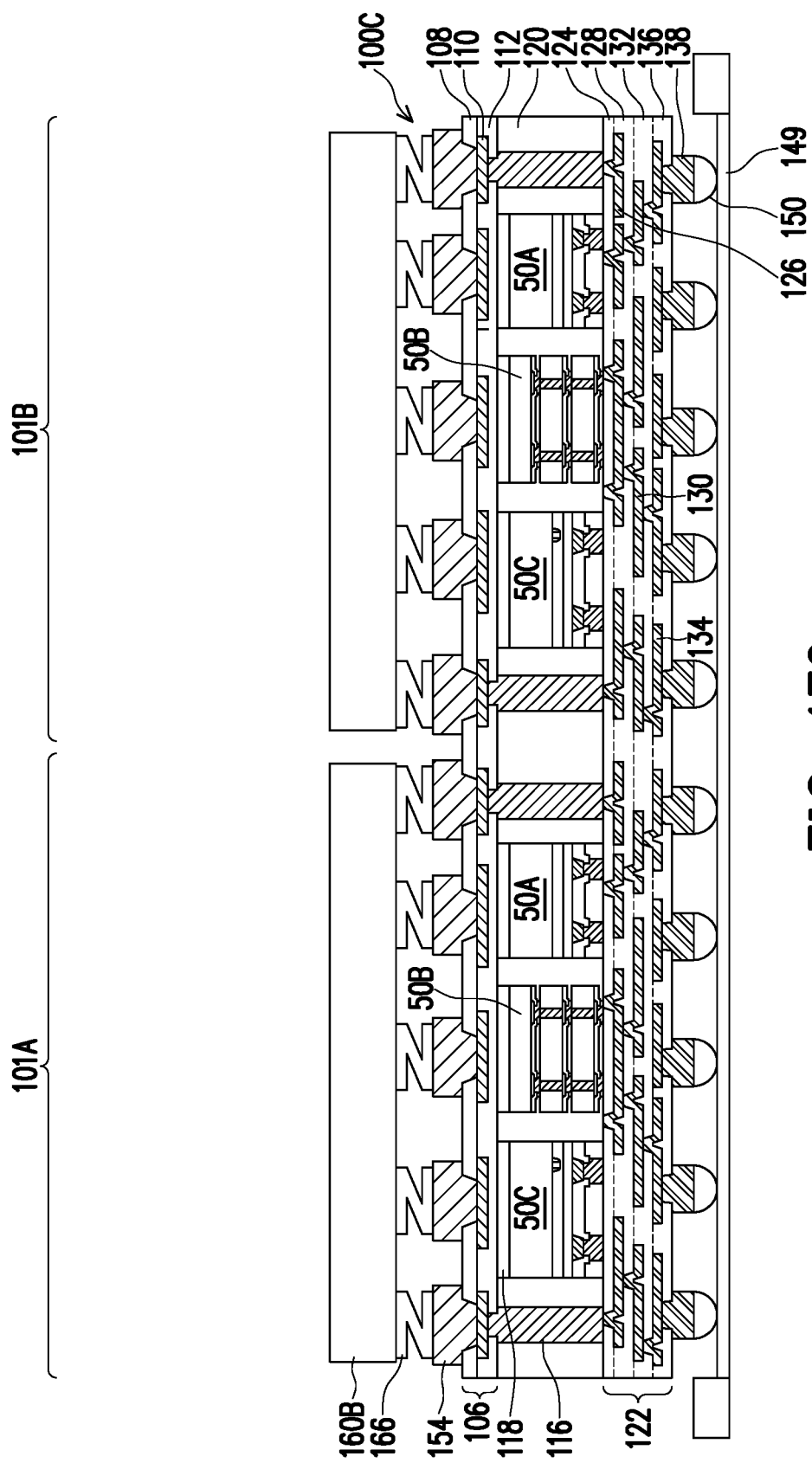

In FIGS. 17A-17C, modules 160 are bonded to the back-side redistribution structure 106. The modules 160 may be power supply modules, memory modules, voltage regulator modules, integrated passive device (IPD) modules, or the like. In some embodiments, the modules 160 may include flip chip bonding, wire bonding, or the like. The modules 160 may be chip-scale packages (CSPs), multi-chip modules (MCMs), or the like. The modules 160 may be packaged circuit board (PCB) modules including discrete integrated circuits and passive device in accordance with some embodiments.

FIG. 17A illustrates modules 160A bonded to the first package components 100A illustrated in FIG. 16A. As illustrated in FIG. 17A, the modules 160A may include pads 162 on which conductive connectors 158 are formed. The pads 162 may be formed in a manner similar to the pads 154, and may be formed of a material similar to the material of the pads 154. The conductive connectors 158 may be formed in a manner similar to the conductive connectors 152, and may be formed of a material similar to the material of the conductive connectors 152. The modules 160A may be placed in the first package region 101A and the second package region 101B using a pick and place machine or the like. Once the modules 160A are placed, the conductive connectors 152 and the conductive connectors 158 may be reflowed to bond the modules 160A to the back-side redistribution structure 106.

An underfill 164 may be formed to fill the gaps between the modules 160A and the back-side redistribution structure 106. The underfill 164 may be formed by a capillary flow process after the modules 160A are attached, or may be formed by a suitable deposition method before the modules 160A are attached.

FIG. 17B illustrates the modules 160A bonded to the first package components 100B illustrated in FIG. 16B. The pads 162 may be formed in a manner similar to the pads 154, and may be formed of a material similar to the material of the pads 154. The modules 160A may be placed in the first package region 101A and the second package region 101B using a pick and place machine or the like. Once the modules 160A are placed, the conductive connectors 152 may be reflowed to bond the modules 160A to the back-side redistribution structure 106.

An underfill 164 may be formed to fill the gaps between the modules 160A and the back-side redistribution structure 106. The underfill 164 may be formed by a capillary flow process after the modules 160A are attached, or may be formed by a suitable deposition method before the modules 160A are attached.

FIG. 17C illustrates modules 160B electrically coupled to the first package components 100C illustrated in FIG. 16C. As illustrated in FIG. 17C, the modules 160B may include spring-type contacts 166. The modules 160B may be placed over the first package components 100C using a pick and place machine or the like such that the spring-type contacts 166 are disposed on the pads 154. The modules 160B may then be attached to the first package components 100B using fasteners, such as fasteners 450 discussed below with respect to FIGS. 30 and 32. The spring-type contacts 166 may be formed of a material such as copper, a copper alloy, plated beryllium copper (e.g., beryllium copper (BeCu) plated with nickel (Ni) and then plated with gold (Au)), combinations thereof, or the like. The spring-type contacts 166 may be formed by a cold forming process or the like. Including the spring-type contacts 166 allows for the modules 160B to be mechanically fastened to the first package components 100C without requiring a bonding or joining process and allows for the modules 160B to be easily replaced. As illustrated in FIG. 17C, in the embodiment in which the spring-type contacts 166 are used to attach the modules 160B to the back-side redistribution structure 106, an underfill material may not be included between the modules 160B and the back-side redistribution structure 106.

In FIGS. 18A-18E, the first package components 100 in the first package region 101A and the second package region 101B are singulated and each of the first package components 100, with or without at attached module 160, is placed in a tray 170. The first package components 100 may be singulated using a dicing process such as sawing, laser drilling, or the like. As illustrated in FIGS. 18A-18E, the first package components 100 include the front-side redistribution structure 122, the encapsulated dies 50, the back-side redistribution structure 106 and any of the conductive connectors 152, the pads 154, and the conductive connectors 156. First packages 200 include the modules 160 bonded to the first package components 100. After the first package components 100 are singulated, each of the first packages 200 is removed from the tape 149 and placed into a tray 170. The trays 170 may be used to provide protection to the first packages 200 until the first packages 200 are placed during subsequent 3D packaging processes (e.g., the process used to attach the first packages 200 to the SoW package 400, illustrated in FIG. 25). Placing the first packages 200 in the trays 170 may improve the reliability and yield of packages produced by the methods of the current application.

Figure 18A:
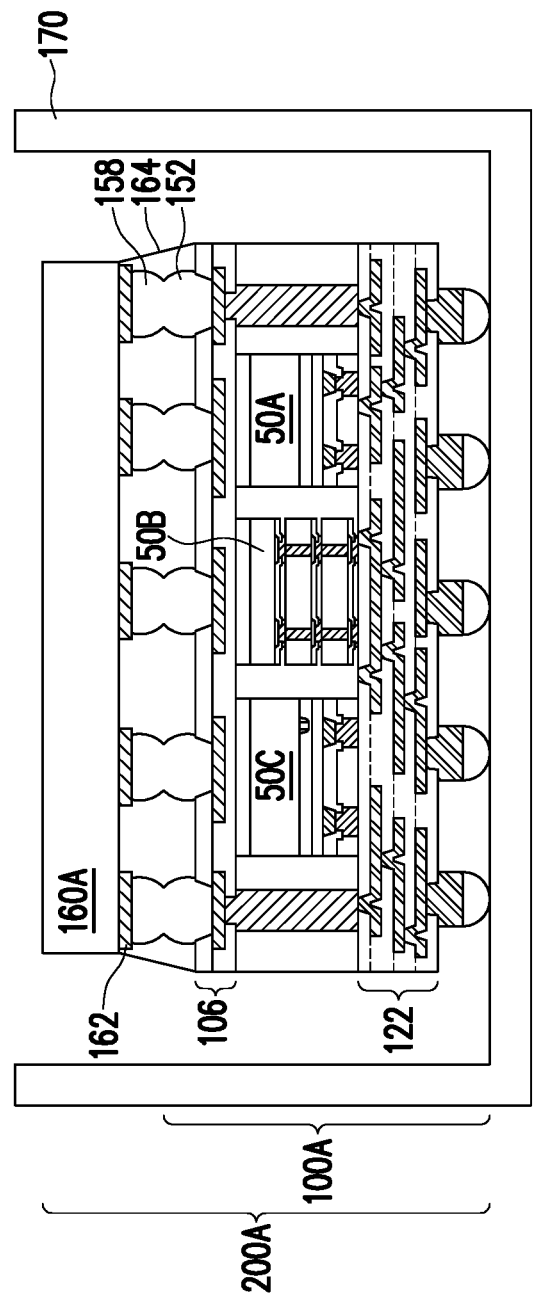
Figure 18B:
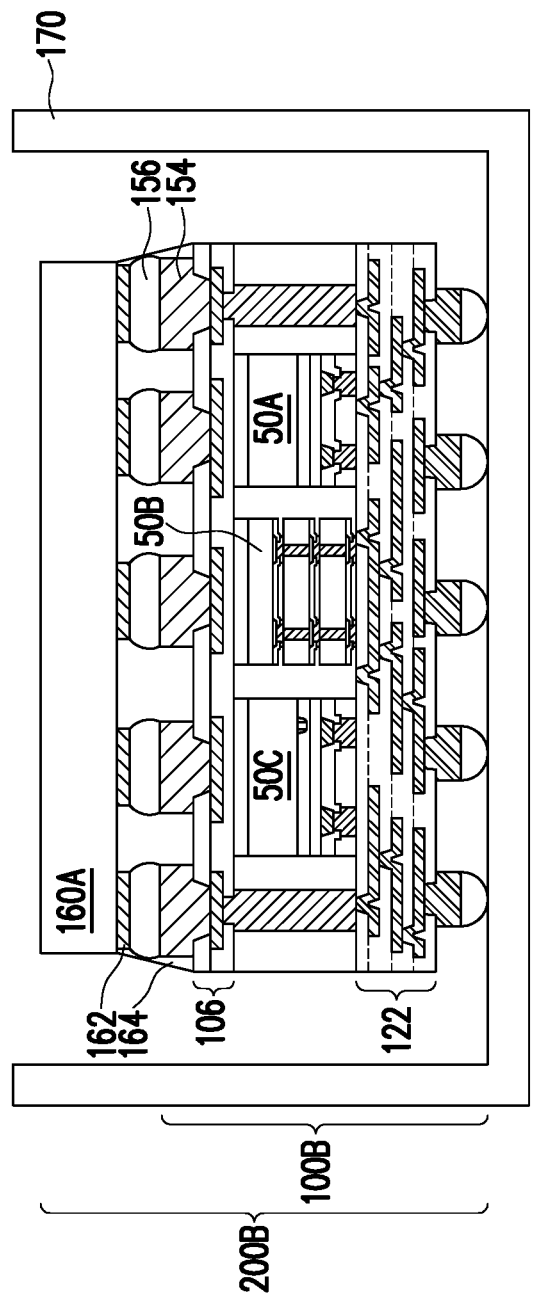
Figure 18C:
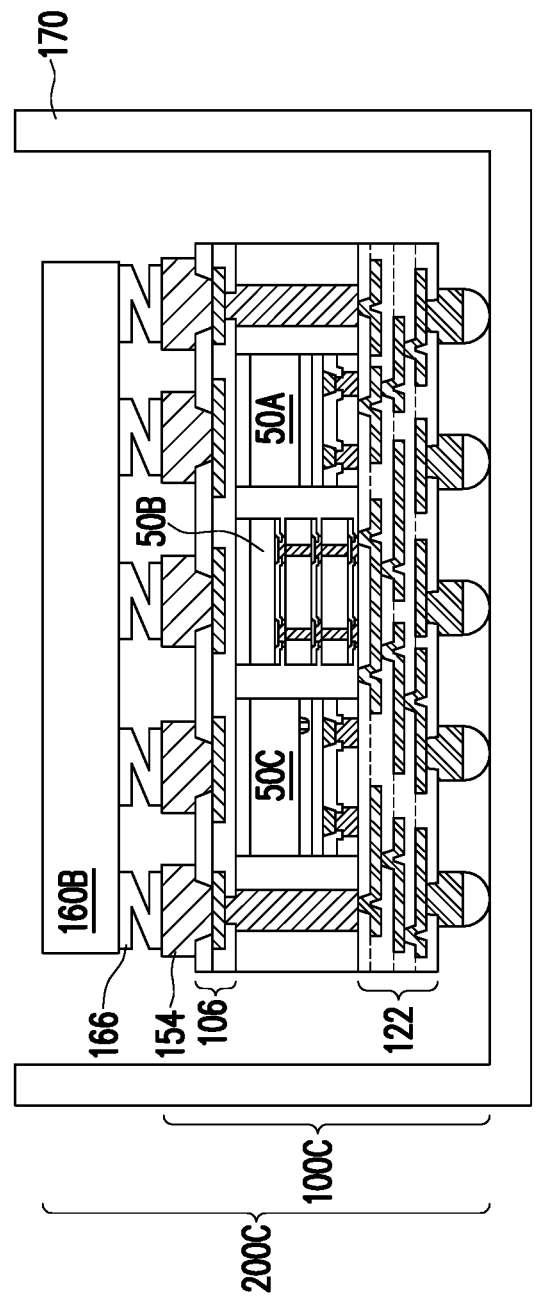
Figure 18D:
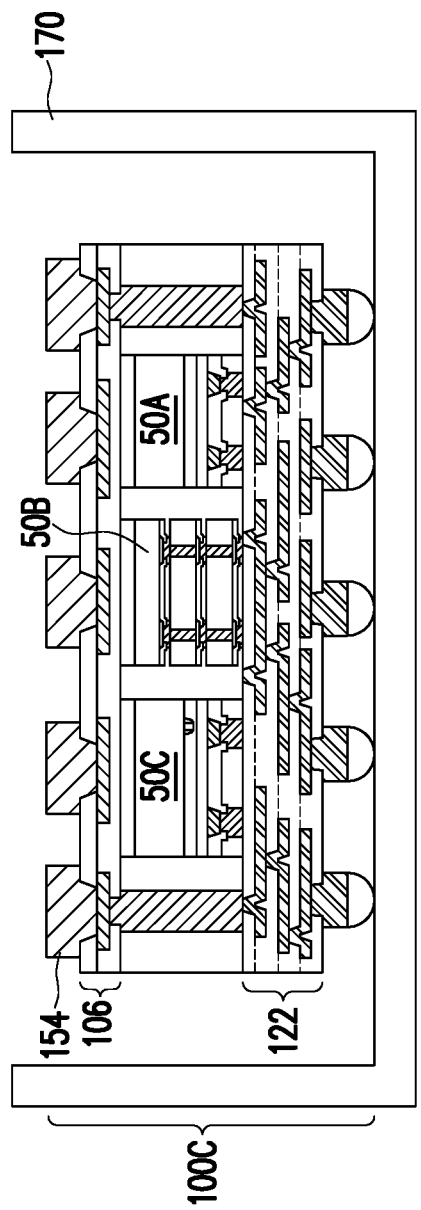

FIG. 18A illustrates a first package 200A including the module 160A bonded to the first package component 100A. The module 160A is bonded to the first package component 100A by solder bonds between the conductive connectors 152 and the conductive connectors 158. The module 160A is coupled to the dies 50 of the first package component 100A through the pads 162, the conductive connectors 158, the conductive connectors 152, and the back-side redistribution structure 106. FIG. 18B illustrates a first package 200B including the module 160A bonded to the first package component 100B. The module 160A is bonded to the first package component 100B by solder bonds between the conductive connectors 156 and the pads 162. The module 160A is coupled to the dies 50 of the first package component 100B through the pads 162, the conductive connectors 156, the pads 154, and the back-side redistribution structure 106. FIG. 18C illustrates a first package 200C including the module 160B bonded to the first package component 100C. The module 160B is placed on the first package component 100C with the spring-type contacts 166 disposed on the pads 154. As will be described with respect to FIG. 30, the module 160B may be subsequently fixed to the first package component 100C using a mechanical brace 450A or the like. The module 160B is coupled to the dies 50 of the first package component 100C through the spring-type contacts 166, the pads 154, and the back-side redistribution structure 106. FIG. 18D illustrates a singulated first package component 100C, including the pads 154 without a conductive connector thereon, placed in the tray 170 without a module 160 being attached to the first package component 100C.

Figure 18E:
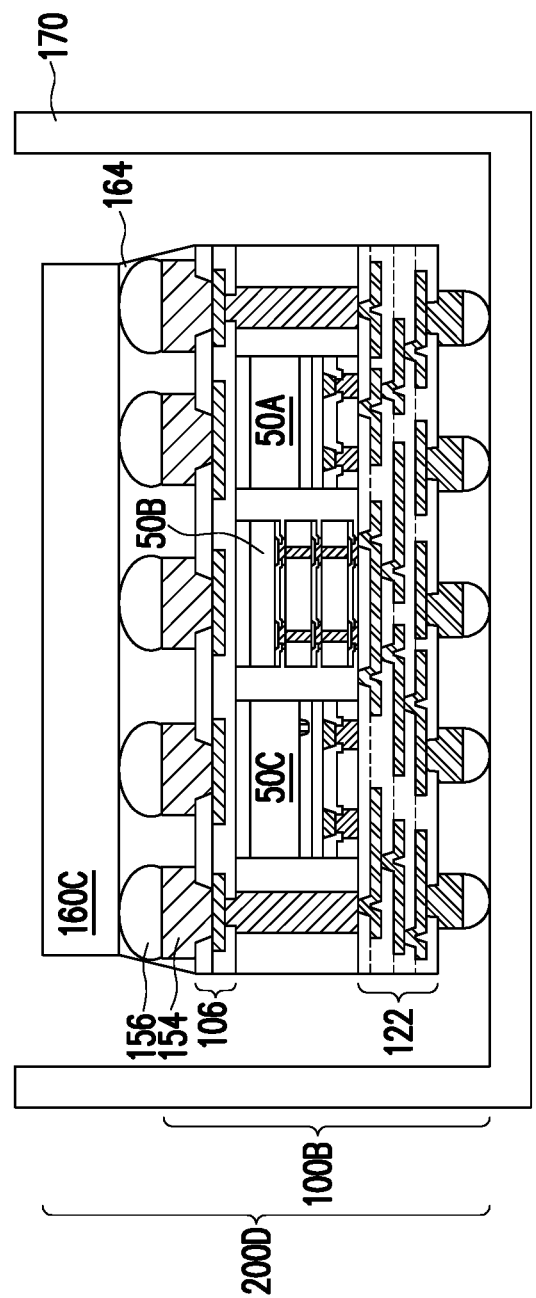

FIG. 18E illustrates a first package 200D including a module 160C bonded to the first package component 100B. The module 160C may include conductive pads (not separately illustrated) level with a surface thereof. The conductive connectors 156 are bonded to the conductive pads of the module 160C. The module 160C may be bonded to the first package component 100B using processes similar to the processes used to bond the module 160A to the first package component 100B, discussed above in reference to FIG. 17B. The module 160C is coupled to the dies 50 of the first package component 100B through the conductive connectors 156, the pads 154, and the back-side redistribution structure 106.

FIGS. 19 through 24 illustrate cross-sectional views of intermediate steps during a process for forming a system-on-wafer (SoW) package 400A, in accordance with some embodiments. In FIG. 19, a carrier substrate 402 is provided and integrated circuit dies 405 are attached to the carrier substrate 402. A release layer 404 may be formed on the carrier substrate 402. The carrier substrate 402 may be a glass carrier substrate, a ceramic carrier substrate, or the like. The carrier substrate 402 may be a wafer, such that multiple packages can be formed on the carrier substrate 402 simultaneously. The release layer 404 may be removed along with the carrier substrate 402 from the overlying structures that will be formed in subsequent steps. In some embodiments, the release layer 404 is any suitable adhesive, epoxy, die attach film (DAF), or the like, and is applied over the surface of the carrier substrate 402.

The integrated circuit dies 405 are attached to the carrier substrate 402 using the release layer 404. A desired type and quantity of integrated circuit dies 405 may be attached to the carrier substrate 102. The integrated circuit dies 405 may be the same as or similar to the active device dies 50C. For example, each of the integrated circuit dies 405 may be a logic die (e.g., central processing unit (CPU), a graphics processing unit (GPU), a system-on-a-chip (SoC), an application processor (AP), a microcontroller, or the like), a memory die (e.g., a dynamic random access memory (DRAM) die, a static random access memory (SRAM) die, a high bandwidth memory (HBM) die, or the like), an input/output (I/O) interface die, a power management die (e.g., a power management integrated circuit (PMIC) die or the like), a radio frequency (RF) die, a sensor die, a micro-electro-mechanical-system (MEMS) die, a signal processing die (e.g., a digital signal processing (DSP) die or the like), a front-end die (e.g., an analog front-end (AFE) die or the like), the like, or combinations thereof.

As illustrated in FIG. 19, the integrated circuit dies 405 may include the same components as the active device dies 50C. For example, the integrated circuit dies may include a semiconductor substrate 52C, a device 54 on the semiconductor substrate 52C, an ILD 56C surrounding the device 54, an interconnect structure 60C over the ILD 56C, pads 62C over the interconnect structure 60C, a passivation film 64C over the interconnect structure 60C and the pads 62C, die connectors 66C coupled to the pads 62C, and a dielectric layer 68C surrounding the die connectors 66C.

In FIG. 20, an encapsulant 406 is formed over the release layer 404, surrounding the integrated circuit dies 405. After formation, the encapsulant 406 encapsulates the integrated circuit dies 405. The encapsulant 406 may be a molding compound, epoxy, or the like, and may be applied by compression molding, transfer molding, or the like. The encapsulant 406 may be applied in liquid or semi-liquid form and subsequently cured. In some embodiments, the encapsulant 406 is formed over the carrier substrate 402 such that the integrated circuit dies 405 are buried or covered, and a planarization process is then performed on the encapsulant 406. The planarization process may planarize the encapsulant 406 as well as the dielectric layers 68C of the integrated circuit dies and may expose the die connectors 66C of the integrated circuit dies 405. Topmost surfaces of the encapsulant 406, the die connectors 66C, and the dielectric layers 68 may be level with one another after the planarization process. The planarization process may be, for example, a chemical-mechanical polish (CMP).

Figure 21:
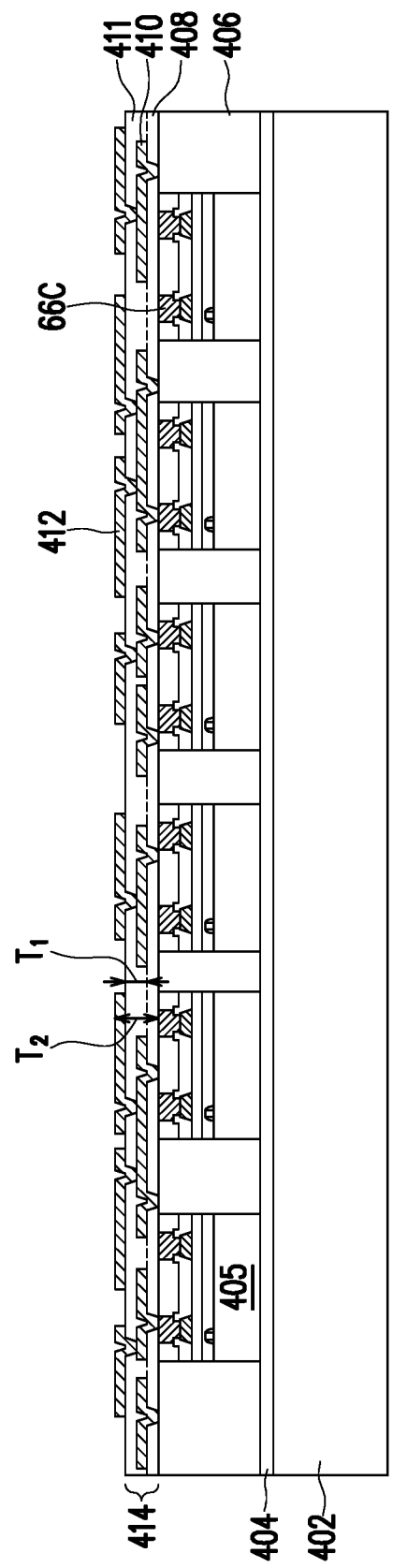
Figure 22:
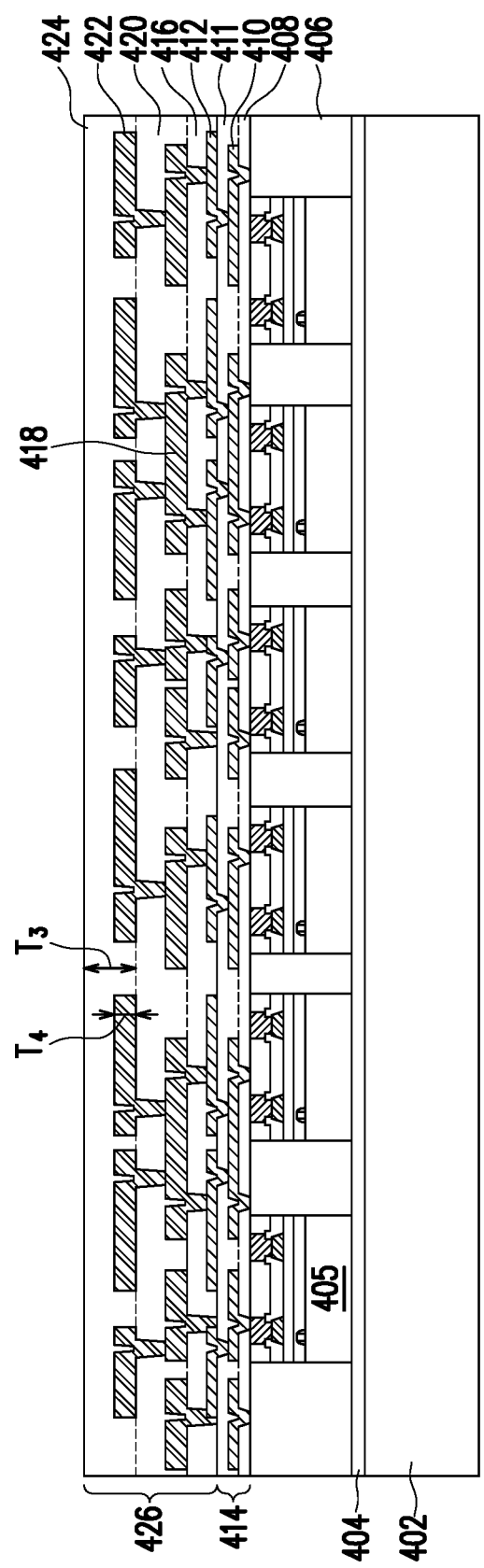
Figure 23:
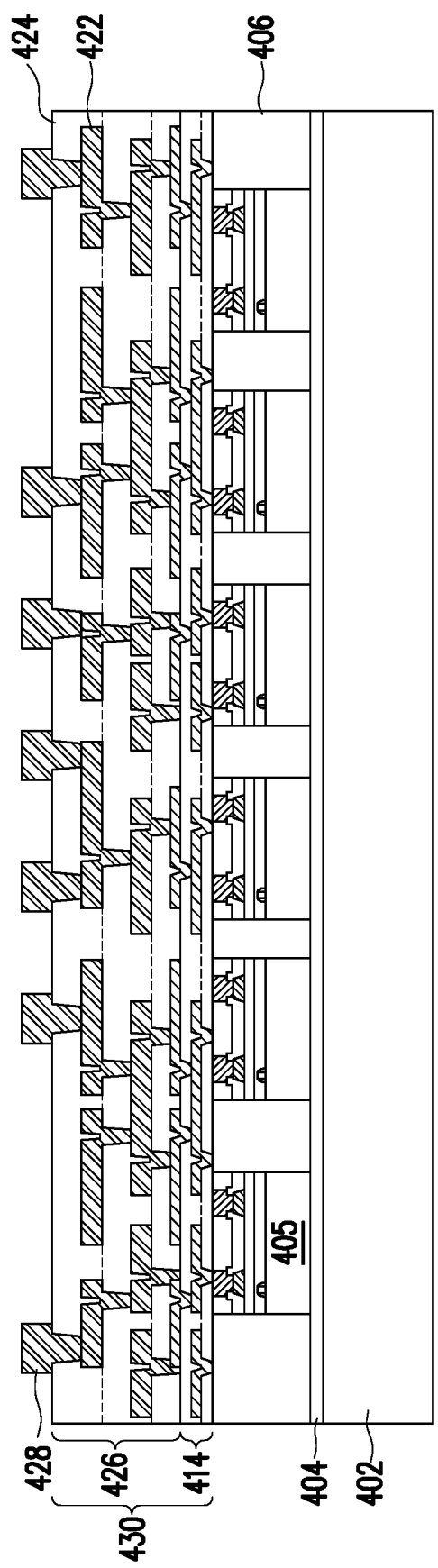

In FIGS. 21 through 23, a redistribution structure 430 (see FIG. 23) having a fine-featured portion 414 and a coarse-featured portion 426 is formed over the encapsulant 406 and the integrated circuit dies 405. The redistribution structure 430 includes metallization patterns, dielectric layers, and under-bump metallurgies (UBMs). The metallization patterns may also be referred to as redistribution layers or redistribution lines. The redistribution structure 430 is shown as an example having four layers of metallization patterns. More or fewer dielectric layers and metallization patterns may be formed in the redistribution structure 430. If fewer dielectric layers and metallization patterns are to be formed, steps and process discussed below may be omitted. If more dielectric layers and metallization patterns are to be formed, steps and processes discussed below may be repeated. The fine-featured portion 414 and the coarse-featured portion 426 of the redistribution structure 430 include metallization patterns and dielectric layers of differing sizes.

In FIG. 21, the fine-featured portion 414 of the redistribution structure 430 is formed. The fine-featured portion 414 of the redistribution structure 430 includes dielectric layers 408 and 411; and metallization patterns 410 and 412. In some embodiments, the dielectric layers 408 and 411 are formed from a same dielectric material, and are formed to a same thickness. Likewise, in some embodiments, the conductive features of the metallization patterns 410 and 412 are formed from a same conductive material, and are formed to a same thickness. In particular, the dielectric layers 408 and 411 have a first thickness $T_1$ that is small, such as in the range of about 5 μm to about 40 μm, and the conductive features of the metallization patterns 410 and 412 have a second thickness $T_2$ that is small, such as in the range of about 1 μm to about 25 μm.

As an example of forming the fine-featured portion 414 of the redistribution structure 430, the dielectric layer 408 is deposited on the encapsulant 406, the dielectric layers 68C, and the die connectors 66C. In some embodiments, the dielectric layer 408 is formed of a photo-sensitive material such as PBO, polyimide, BCB, or the like, which may be patterned using a lithography mask. The dielectric layer 408 may be formed by spin coating, lamination, CVD, the like, or a combination thereof. The dielectric layer 408 is then patterned. The patterning forms openings exposing portions of the die connectors 66C. The patterning may be by an acceptable process, such as by exposing the dielectric layer 408 to light when the dielectric layer 408 is a photo-sensitive material or by etching using, for example, an anisotropic etch. If the dielectric layer 408 is a photo-sensitive material, the dielectric layer 408 can be developed after the exposure.

The metallization pattern 410 is then formed. The metallization pattern 410 has line portions (also referred to as conductive lines or traces) on and extending along the major surface of the dielectric layer 408, and has via portions (also referred to as conductive vias) extending through the dielectric layer 408 to physically and electrically couple the die connectors 66C of the integrated circuit dies 405. As an example, the metallization pattern 410 may be formed by forming a seed layer over the dielectric layer 408 and in the openings extending through the dielectric layer 408. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 410. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The combination of the conductive material and underlying portions of the seed layer form the metallization pattern 410. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching.

The dielectric layer 411 is then deposited on the metallization pattern 410 and the dielectric layer 408. The dielectric layer 411 may be formed in a manner similar to the dielectric layer 408, and may be formed of a material similar to the material of the dielectric layer 408. The metallization pattern 412 is then formed. The metallization pattern 412 has line portions on and extending along the major surface of the dielectric layer 411, and has via portions extending through the dielectric layer 411 to physically and electrically couple the metallization pattern 410. The metallization pattern 412 may be formed in a manner similar to the metallization pattern 410, and may be formed of a material similar to the material of the metallization pattern 410. Although the fine-featured portion 414 is illustrated as including two dielectric layers and two metallization patterns, any number of dielectric layers and metallization patterns may be formed in the fine-featured portion 414.

In FIG. 22, the coarse-featured portion 426 of the redistribution structure 430 is formed. The coarse-featured portion 426 of the redistribution structure 430 includes dielectric layers 416, 420, and 424; and metallization patterns 418 and 422. In some embodiments, the dielectric layers 416, 420, and 424 are formed from a same dielectric material, and are formed to a same thickness. Likewise, in some embodiments, the conductive features of the metallization patterns 418 and 422 are formed from a same conductive material, and are formed to a same thickness. In particular, the dielectric layers 416, 420, and 424 have a third thickness $T_3$ that is large, such as in the range of about 5 μm to about 40 μm, and the conductive features of the metallization patterns 418 and 422 have a fourth thickness $T_4$ that is large, such as in the range of about 1 μm to about 25 μm. In various embodiments, the third thickness $T_3$ may be greater than the first thickness $T_1$ (see FIG. 21), and the fourth thickness $T_4$ may be greater than the second thickness $T_2$ (see FIG. 21).

To form the coarse-featured portion 426 of the redistribution structure 430, the dielectric layer 416 may be deposited on the metallization pattern 412 and the dielectric layer 411. The dielectric layer 416 may be formed in a manner similar to the dielectric layer 408, and may be formed of a material similar to the material of the dielectric layer 408. The metallization pattern 418 is then formed. The metallization pattern 418 has line portions on and extending along the major surface of the dielectric layer 416, and has via portions extending through the dielectric layer 416 to physically and electrically couple the metallization pattern 412. The metallization pattern 418 may be formed in a manner similar to the metallization pattern 410, and may be formed of a material similar to the material of the metallization pattern 410.

The dielectric layer 420 is then deposited on the metallization pattern 418 and the dielectric layer 416. The dielectric layer 420 may be formed in a manner similar to the dielectric layer 408, and may be formed of a material similar to the material of the dielectric layer 408. The metallization pattern 422 is then formed. The metallization pattern 422 has line portions on and extending along the major surface of the dielectric layer 420, and has via portions extending through the dielectric layer 420 to physically and electrically couple the metallization pattern 418. The metallization pattern 422 may be formed in a manner similar to the metallization pattern 410, and may be formed of a material similar to the material of the metallization pattern 410.

The dielectric layer 424 is then deposited on the metallization pattern 422 and the dielectric layer 420. The dielectric layer 424 may be formed in a manner similar to the dielectric layer 408, and may be formed of a material similar to the material of the dielectric layer 408. Although the coarse-featured portion 426 is illustrated as including three dielectric layers and two metallization patterns, any number of dielectric layers and metallization patterns may be formed in the coarse-featured portion 426. In some embodiments, the fine-featured portion 414 and the coarse-featured portion 426 may each include 3 dielectric layers and 3 metallization patterns.

The coarse-featured portion 426 may have lower resistance compared to the fine-featured portion 414 due to the thickness of the metallization patterns included in the coarse-featured portion 426 and the fine-featured portion 414. The coarse-featured portion 426 may be used to route power lines due to the lower resistance. The fine-featured portion 414 may be used to route signal lines, which do not require the lower resistance. Including both the coarse-featured portion 426 and the fine-featured portion 414 allows for power lines and signal lines to be routed, while minimizing the thickness of the redistribution structure 430.

In FIG. 23, UBMs 428 are formed for external connection to the redistribution structure 430. The UBMs 428 have bump portions on and extending along the major surface of the dielectric layer 424, and have via portions extending through the dielectric layer 424 to physically and electrically couple the metallization pattern 422. As a result, the UBMs 428 are electrically coupled to the integrated circuit dies 405. The UBMs 428 may be formed in a similar manner and of a similar material as the metallization pattern 410. In some embodiments, the UBMs 428 have a different size than the metallization patterns 410, 412, 418, and 422.

Figure 24:
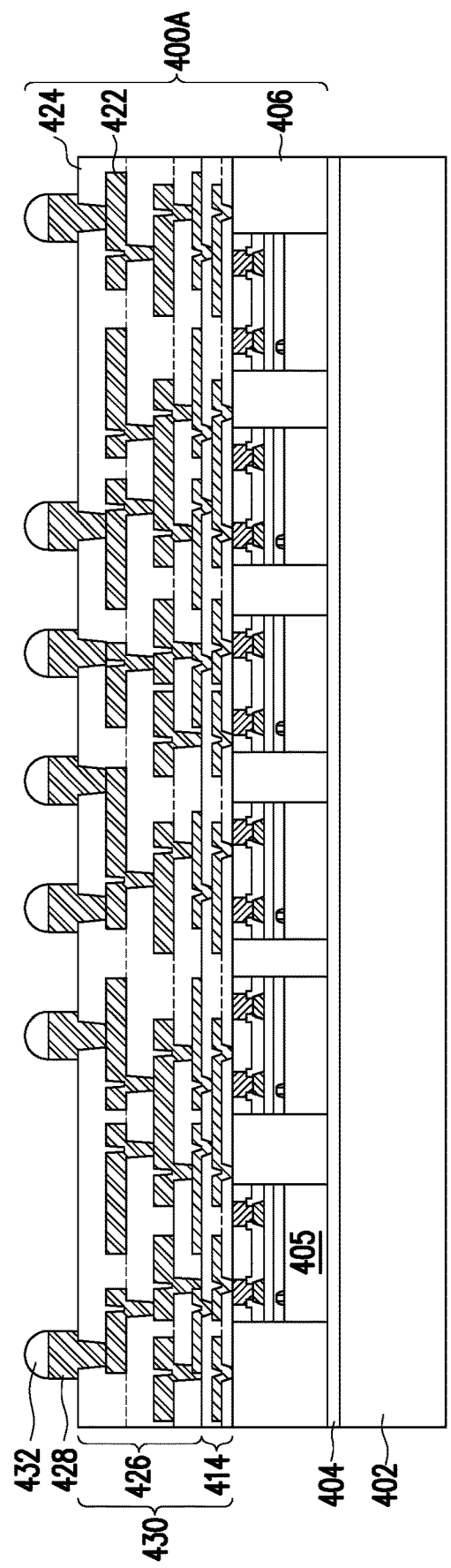

In FIG. 24, conductive connectors 432 are formed on the UBMs 428, forming the SoW package 400A. The conductive connectors 432 may be ball grid array (BGA) connectors, solder balls, metal pillars, controlled collapse chip connection (C4) bumps, micro bumps, electroless nickel-electroless palladium-immersion gold technique (ENEPIG) formed bumps, electroless nickel-immersion gold technique (ENIG) formed bumps or the like. The conductive connectors 432 may include a conductive material such as solder, copper, aluminum, gold, nickel, silver, palladium, tin, the like, or a combination thereof. In some embodiments, the conductive connectors 432 are formed by initially forming a layer of solder or solder paste through evaporation, electroplating, printing, solder transfer, ball placement, or the like. Once a layer of solder has been formed on the structure, a reflow may be performed in order to shape the material into the desired bump shapes.

Figure 25:
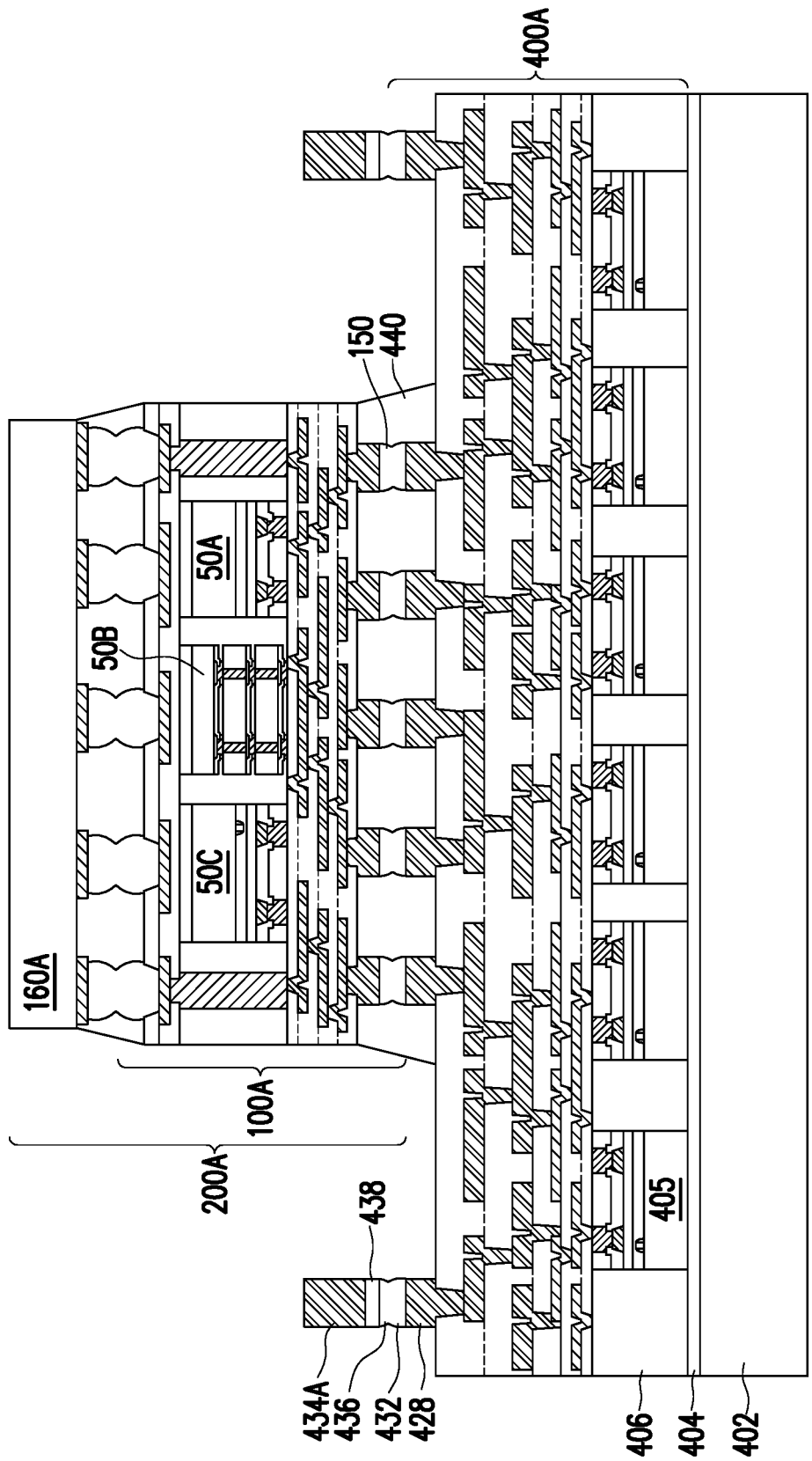
FIGS. 25-32 illustrate cross-sectional views of intermediate steps during a process for forming a packaged device, in accordance with some embodiments.

In FIG. 25, a first package 200A, including a module 160A bonded to a first package component 100A, and external connectors 434A are bonded to the SoW package 400A. In various embodiments, the SoW package 400A may be a super-large fan-out wafer-level package having an area of 10,000 mm² or greater. The first package 200A may be placed over the SoW package 400A using a pick and place machine or the like. Once the first package 200A is placed, the conductive connectors 432 and the conductive connectors 150 may be reflowed to bond the first package 200A to the SoW package 400A. Although FIG. 25 illustrates a first package 200A attached to the SoW package 400A, the first package 200B or the first package 200C may alternatively or additionally be attached to the SoW package 400A.

Further, external connectors 434A are attached to the SoW package 400A. The external connectors 434A are electrical and physical interfaces for the SoW package 400A to other SoW packages 400A, other external systems, or the like. For example, when the SoW package 400A is installed as part of a larger external system, such as a data center, the external connectors 434A may be used to couple the SoW package 400A to the external system. Examples of external connectors 434A include large wire bonds, receptors for ribbon cables, flexible printed circuits, or the like. The external connectors 434A include pads 438, which may be similar to the UBMs 428. The external connectors 434A may include different components, such as a chassis, the pads 438, and external connection pins, which may comprise different materials. The external connectors 434A also include conductive connectors 436 on the pads 438, which may be similar to the conductive connectors 432. The pads 438 and the conductive connectors 432 are used for physical and electrical connection to the SoW package 400A. Attaching the external connectors 434A may include placing the external connectors 434A on the SoW package 400A using a pick and place machine or the like and then reflowing the conductive connectors 436 and the conductive connectors 432 to physically and electrically couple the pads 438 and UBMs 428.

An underfill 440 may be formed to fill the gaps between the first package 200A and the SoW package 400A. The underfill 440 may be formed by a capillary flow process after the first package 200A is attached, or may be formed by a suitable deposition method before the first package 200A is attached.

Figure 26:
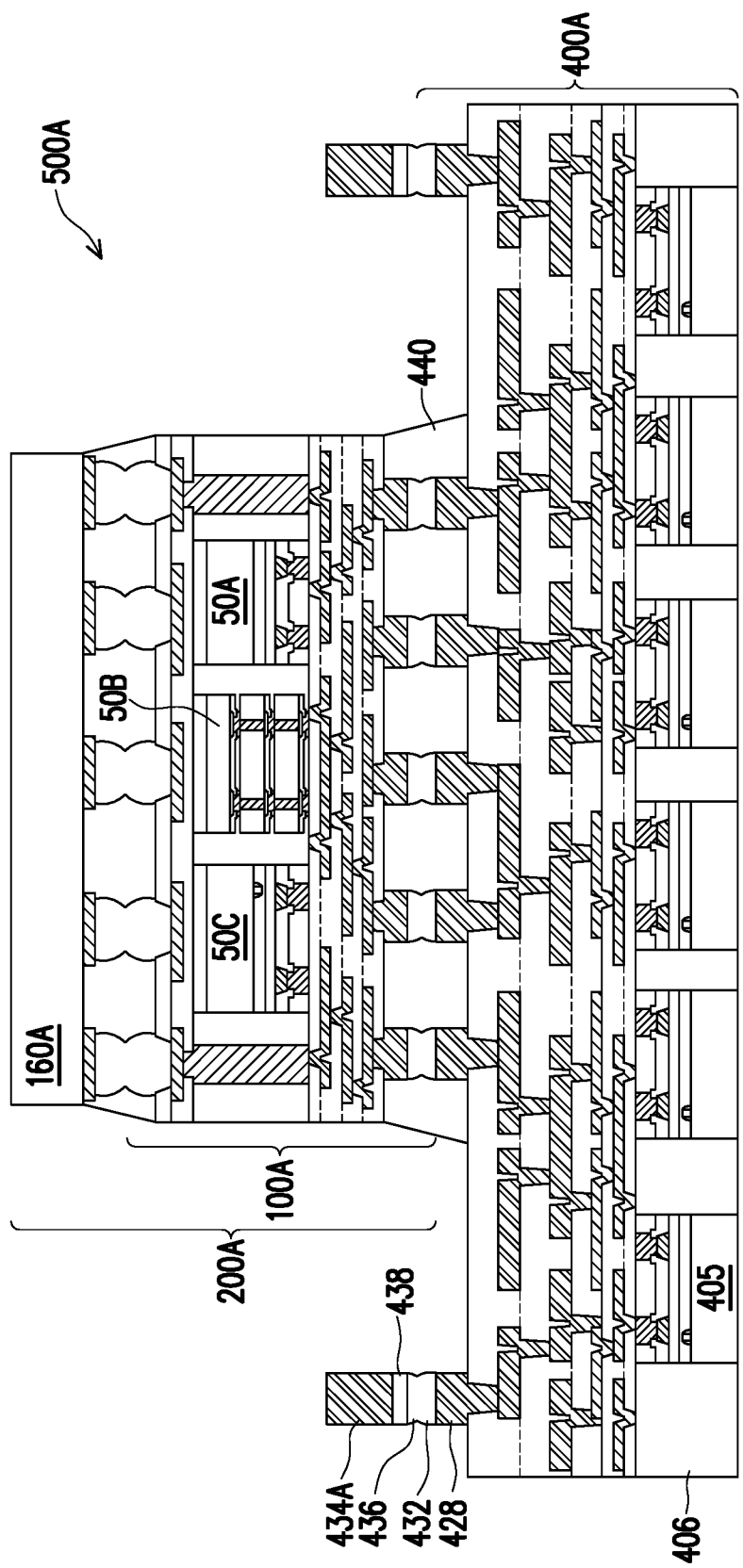

In FIG. 26, the carrier substrate 402 is de-bonded from the encapsulant 406 and the integrated circuit dies 405 to form a packaged device 500A. In accordance with some embodiments, the de-bonding includes projecting a light such as a laser light or a UV light on the release layer 404 so that the release layer 404 decomposes under the heat of the light and the carrier substrate 402 can be removed.

Figure 27:
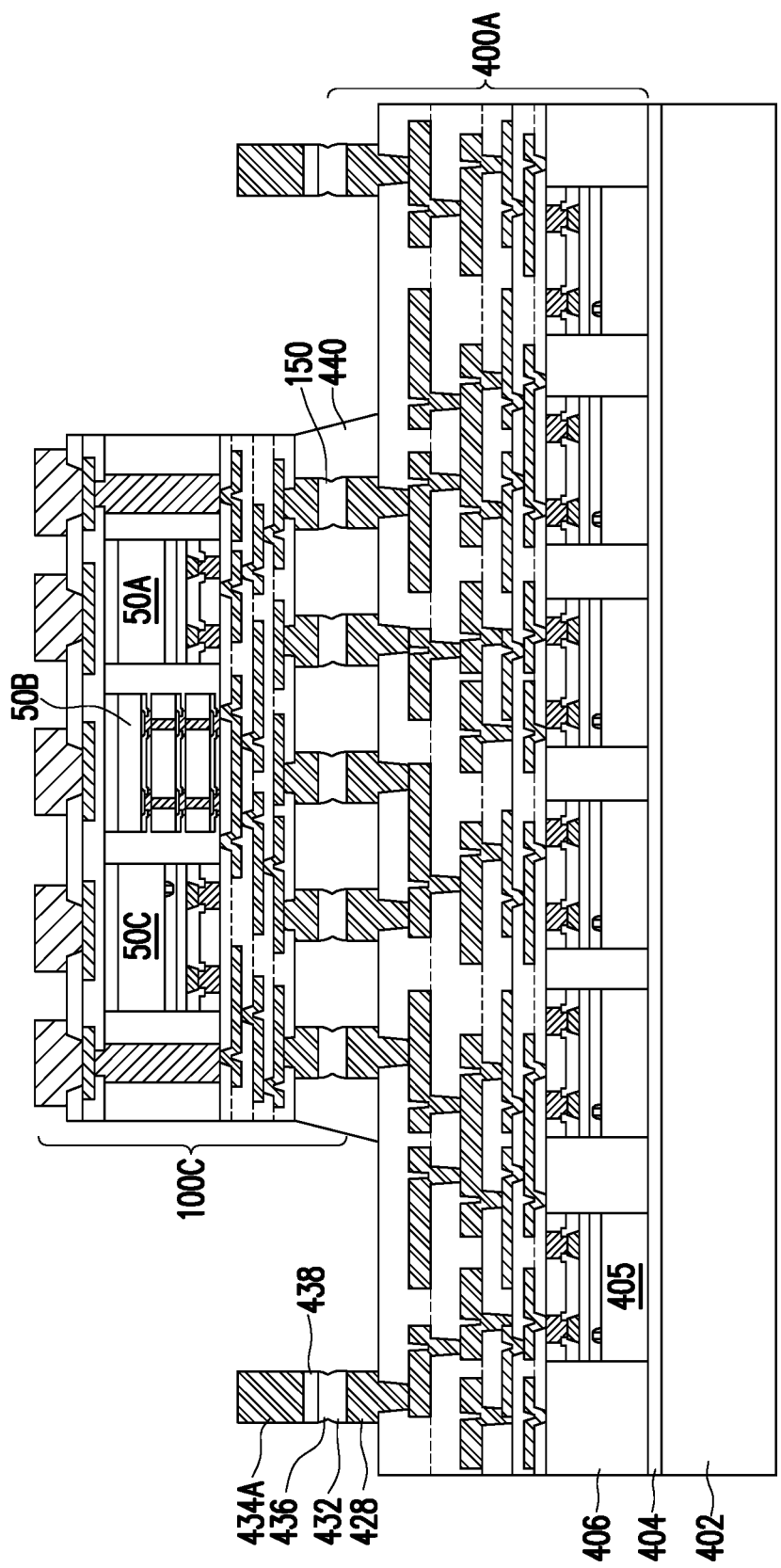

FIG. 27 illustrates an embodiment in which the first package component 100C is bonded to the SoW package 400A, rather than the first package 200A being bonded to the SoW package, as illustrated in FIG. 25. The first package component 100C may be placed over the SoW package 400A using a pick and place machine or the like. Once the first package component 100C is placed, the conductive connectors 432 and the conductive connectors 150 may be reflowed to bond the first package component 100C to the SoW package 400A. The external connectors 434A, including the pads 438 and the conductive connectors 436 are also bonded to the SoW package 400A using the same methods as discussed above with reference to FIG. 25.

An underfill 440 may be formed to fill the gaps between the first package component 100C and the SoW package 400A. The underfill 440 may be formed by a capillary flow process after the first package component 100C is attached, or may be formed by a suitable deposition method before the first package component 100C is attached.

Figure 28:
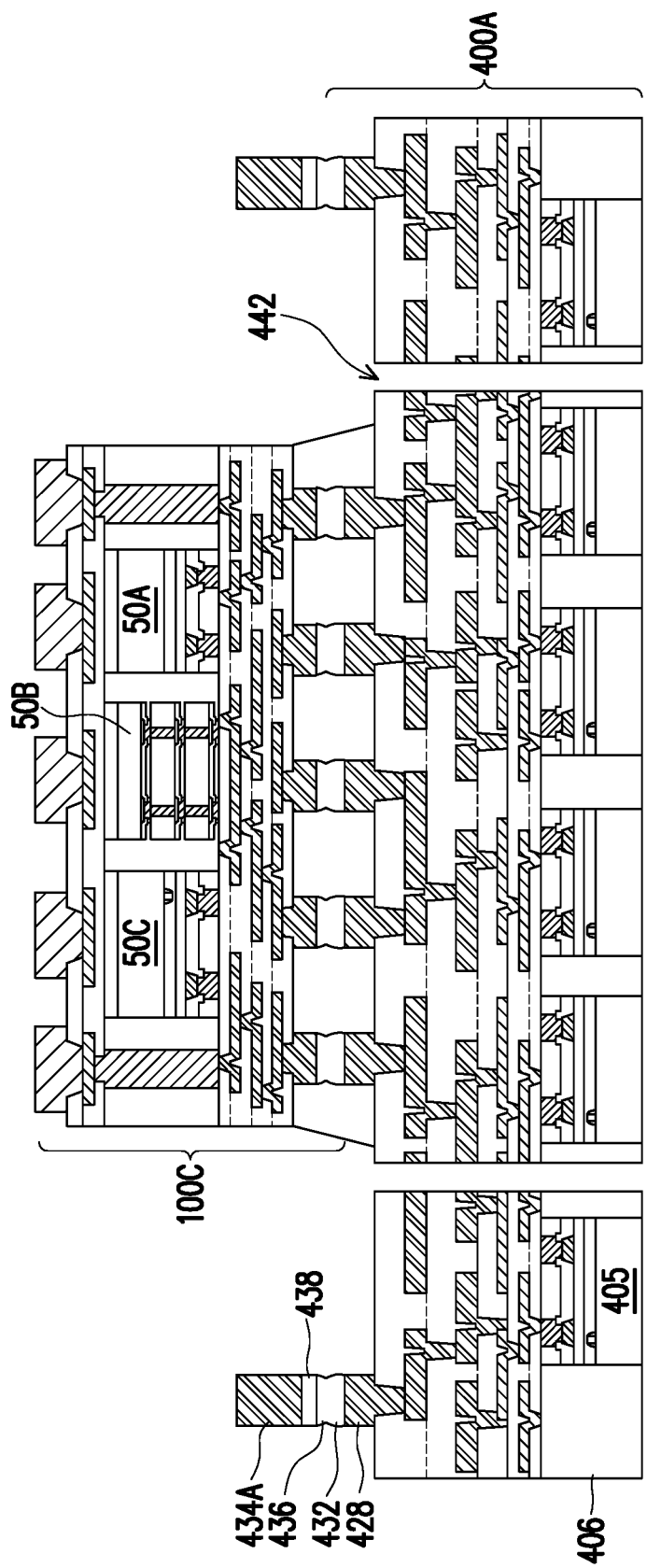

In FIG. 28, the carrier substrate 402 is de-bonded from the encapsulant 406 and the integrated circuit dies 405 and bolt holes 442 are formed through the SoW package 400A. In accordance with some embodiments, the de-bonding includes projecting a light such as a laser light or a UV light on the release layer 404 so that the release layer 404 decomposes under the heat of the light and the carrier substrate 402 can be removed. The bolt holes 442 may be formed by a drilling process such as laser drilling, mechanical drilling, or the like. The bolt holes 442 may be formed by drilling an outline for the bolt holes 442 with the drilling process, and then removing the material separated by the outline.

Figure 29:
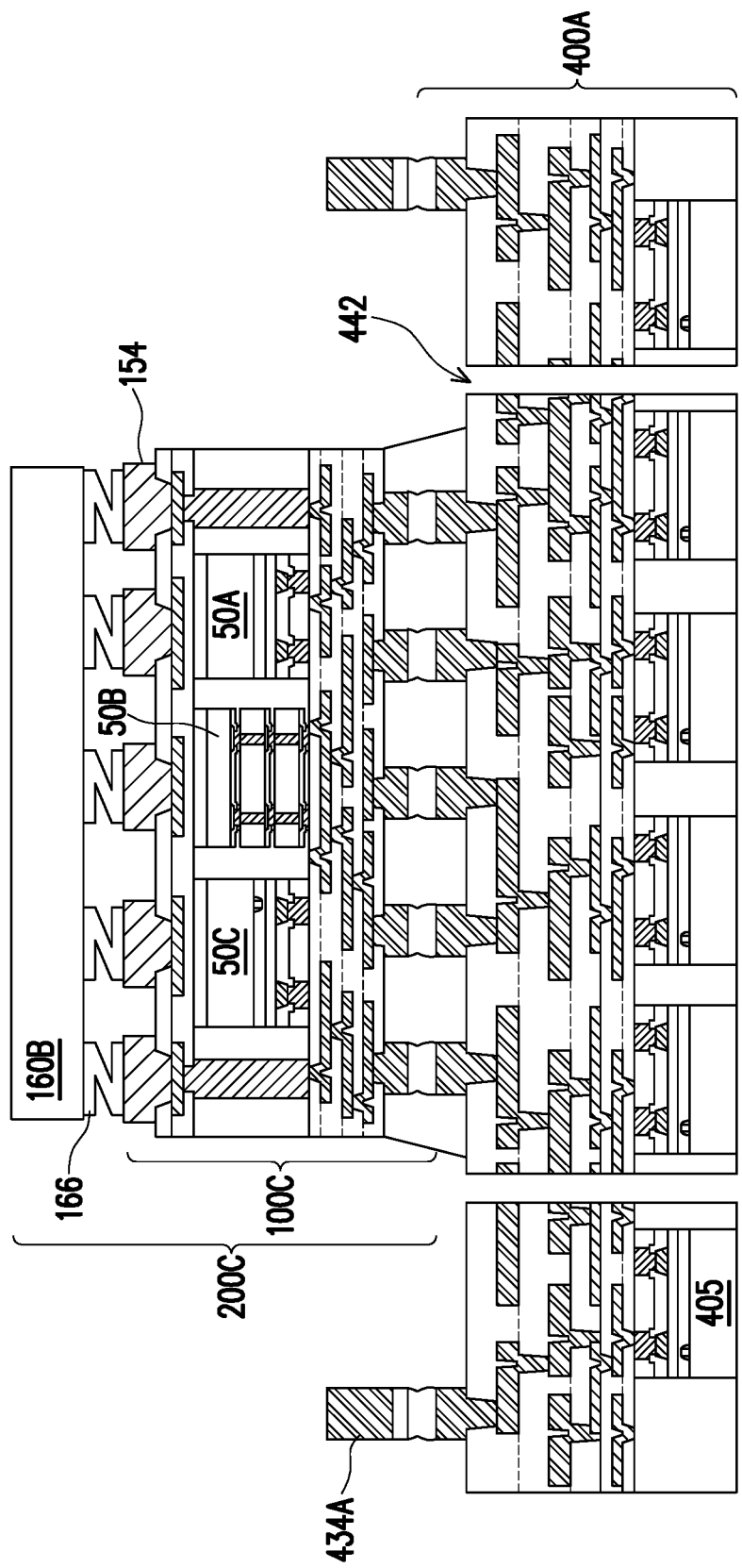

In FIG. 29, a module 160B, including spring-type contacts 166 is placed on the first package component 100C to form a first package 200C. The module 160B may be similar to or the same as the module 160B discussed above in reference to FIG. 17C and the spring-type contacts 166 may be the same as or similar to the spring-type contacts 166 discussed above in reference to FIG. 17C. The module 160B may be placed over the first package component 100C using a pick and place machine or the like.

Figure 30:
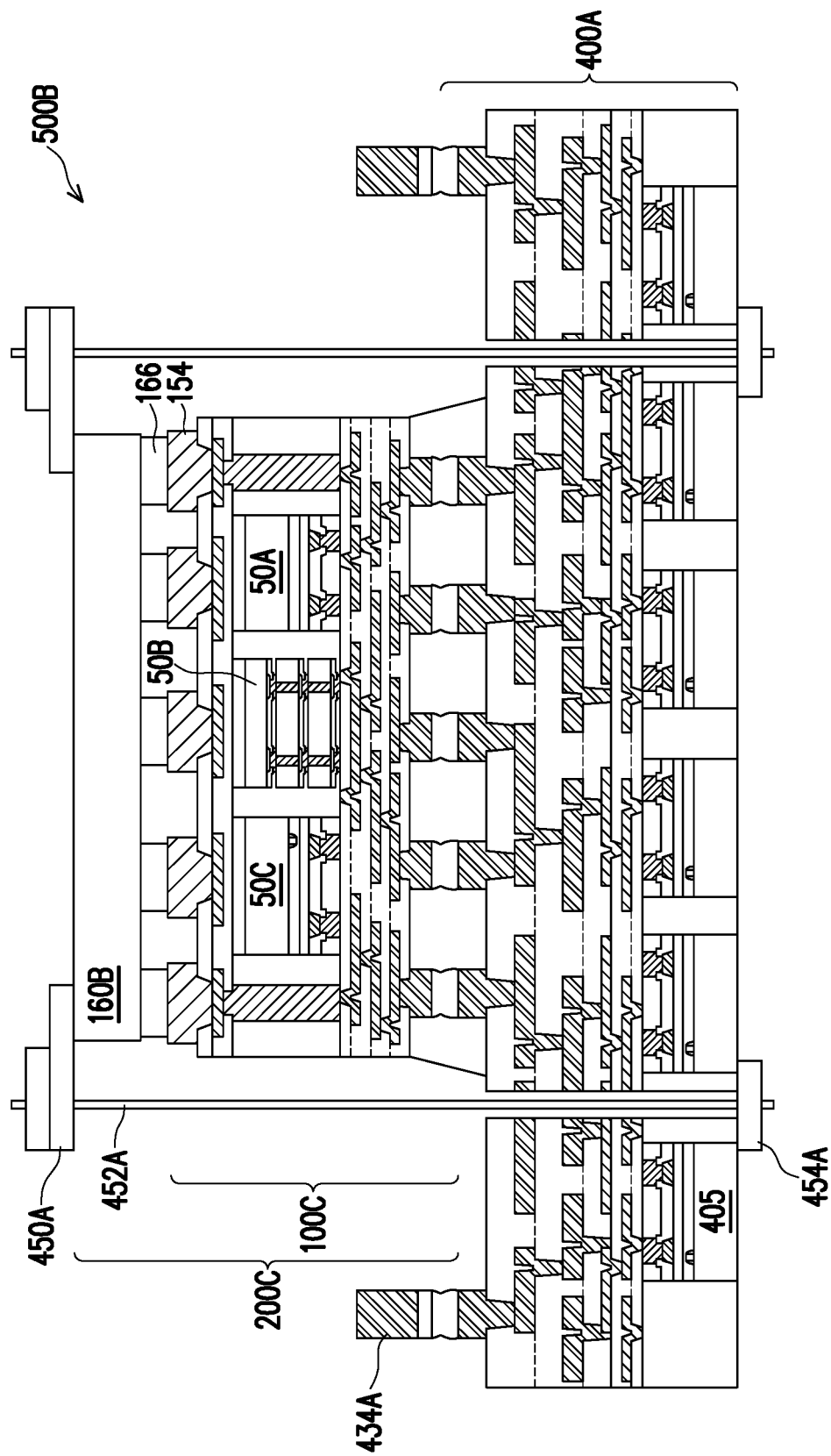

In FIG. 30, a mechanical brace 450A is installed to secure the module 160B to the first package component 100C and the SoW package 400A, forming a packaged device 500B. The mechanical brace 450A is a rigid support that may be formed from a material with a high stiffness, such as a metal which may include steel, titanium, cobalt, or the like. The mechanical brace 450A physically engages portions of the module 160B. Using the mechanical brace 450A to clamp the module 160C to the first package component 100C and the SoW package 400A may reduce any warpage in the packaged device 500B.

The module 160C is fastened between the first package component 100C and the mechanical brace 450A with bolts 452A. The bolts 452A are threaded through the bolt holes 442 of the SoW package 400 and through corresponding bolt holes in the mechanical brace 450A. Fasteners 454A are threaded onto the bolts 452A and tightened to clamp the module 160C between the first package component 100C and the mechanical brace 450A. The fasteners 454A may be, for example, nuts that thread to the bolts 452A. The fasteners 454A may be tightened on the bolts 452A such that the spring-type contacts 166 are compressed. After being attached, portions of the mechanical brace 450A are disposed between the module 160C and the external connectors 434A. The embodiment illustrated in FIG. 30 may not include an underfill disposed between the module 160B and the first package component 100C and portions of the module 160B may be separated from the first package component 100C by an opening or gap.

Figure 31:
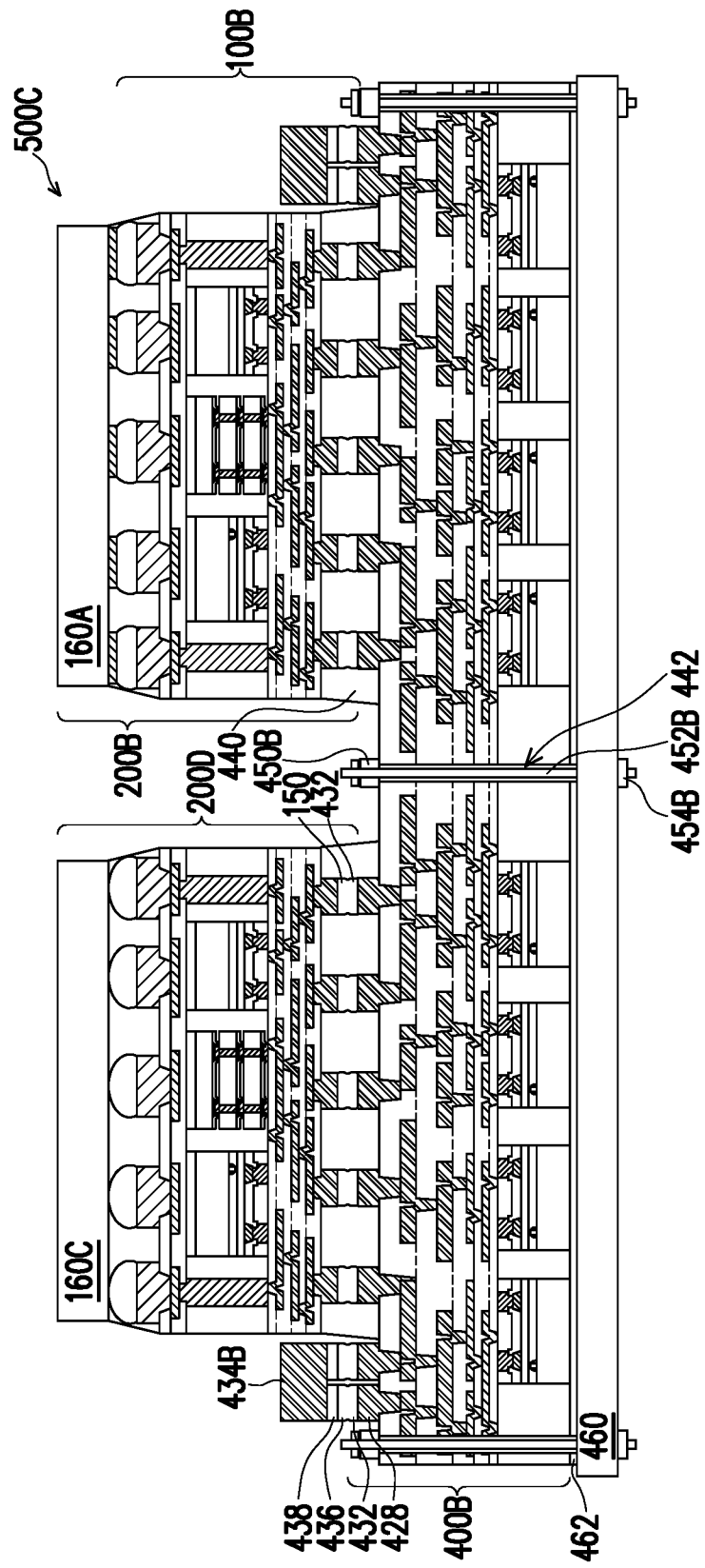

FIG. 31 illustrates a packaged device 500C including a first package 200B (which includes a module 160A bonded to a first package component 100B), a first package 200D (which includes a module 160C bonded to a first package component 100B), and a SoW package 400B, in accordance with an embodiment. The SoW package 400B may be formed in a manner similar to the SoW package 400A, and may be formed of materials similar to the materials of the SoW package 400A, but may include two regions in which the first packages 200B and 200D are bonded. In various embodiments, the SoW package 400B may be a super-large fan-out wafer-level package having an area of 10,000 mm² or greater. The first package 200B may be separated from the second package 200D by a distance from about 0.05 mm to about 10 mm, such as about 0.5 mm.

The first packages 200B and 200D may be placed over the SoW package 400B using a pick and place machine or the like. Once the first packages 200B and 200D are placed, the conductive connectors 432 and the conductive connectors 150 may be reflowed to bond the first packages 200B and 200D to the SoW package 400B. Although FIG. 31 illustrates first packages 200B and 200D attached to the SoW package 400B, any combination of the first packages 200A-200D may alternatively or additionally be attached to the SoW package 400B. Underfills 440 may be formed to fill the gaps between the first packages 200B and 200D and the SoW package 400B. The underfills 440 may be formed by capillary flow processes after the first packages 200B and 200D are attached, or may be formed by a suitable deposition method before the first packages 200B and 200D are attached.

Further, external connectors 434B are attached to the SoW package 400B. The external connectors 434B are electrical and physical interfaces for the SoW package 400B to other SoW packages 400B, other external systems, or the like. For example, when the SoW package 400B is installed as part of a larger external system, such as a data center, the external connectors 434B may be used to couple the SoW package 400B to the external system. Examples of external connectors 434B include large wire bonds, receptors for ribbon cables, flexible printed circuits, or the like. The external connectors 434B include pads 438, which may be similar to the UBMs 428. The external connectors 434B may include different components, such as a chassis, the pads 438, and external connection pins, which may comprise different materials. The external connectors 434B also include conductive connectors 436 on the pads 438, which may be similar to the conductive connectors 432. The pads 438 and the conductive connectors 432 are used for physical and electrical connection to the SoW package 400B. Attaching the external connectors 434B may include placing the external connectors 434B on the SoW package 400B using a pick and place machine or the like and then reflowing the conductive connectors 436 and the conductive connectors 432 to physically and electrically couple the pads 438 and UBMs 428.

A mechanical brace 450B is installed to secure a thermal module 460 to a back-side of the SoW package 400B. The thermal module 460 may be a heat sink, a heat spreader, a cold plate, or the like. The mechanical brace 450B is a rigid support that may be formed from a material with a high stiffness, such as a metal which may include steel, titanium, cobalt, or the like. The mechanical brace 450B physically engages portions of the SoW package 400B. Using the mechanical brace 450B to clamp the thermal module 460 to the SoW package 400B may reduce any warpage in the SoW package 400B.

The thermal module 460 is fastened to the back-side of the SoW package 400B with bolts 452B. The bolts 452B are threaded through bolt holes 442 formed in the SoW 400B and through corresponding bolt holes in the mechanical brace 450B. Fasteners 454B are threaded onto the bolts 452B and tightened to clamp the thermal module 460 to the SoW package 400B, with the SoW package 400B being disposed between the mechanical brace 450B and the thermal module 460. The fasteners 454B may be, for example, nuts that thread to the bolts 452B. After being attached, portions of the mechanical brace 450B are disposed between the first package 200B and the first package 200B, and outside of the external connectors 434B.

Before fastening together the thermal module 460 and the SoW package 400B, a thermal interface material (TIM) 462 may be dispensed on the back side of the SoW package 400B, physically and thermally coupling the thermal module 460 to the SoW package 400B. In some embodiments, the TIM 462 is formed of a film comprising indium, a thermal grease, a thermal sheet, a phase change material, combinations thereof, or the like. During fastening, the fasteners 454B are tightened, thereby increasing the mechanical force applied to the SoW package 400B by the thermal module 460 and the mechanical brace 450B. The fasteners 454B are tightened until the thermal module 460 exerts a desired amount of pressure on the TIM 462.

Figure 32:
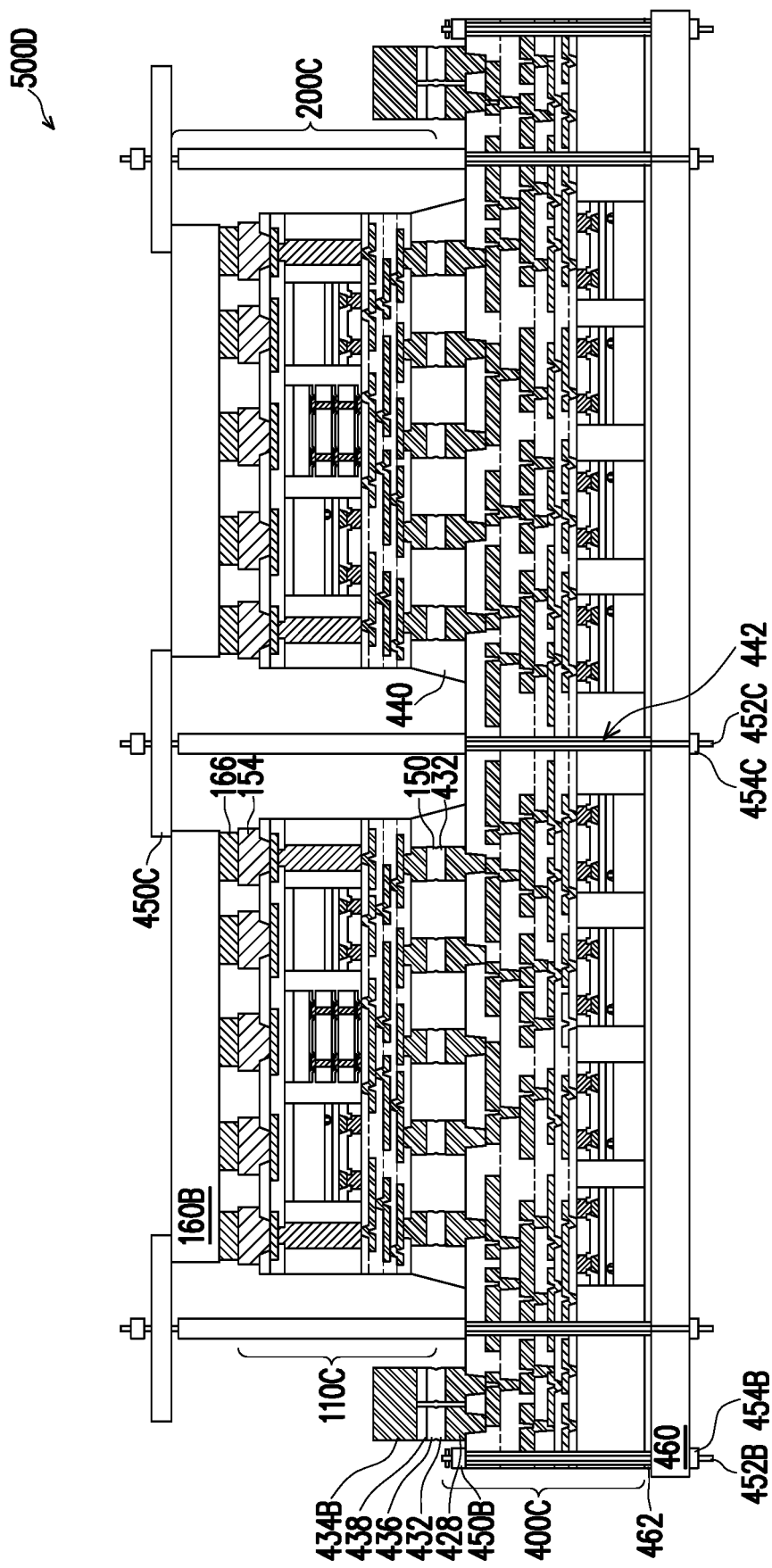

FIG. 32 illustrates a packaged device 500D including modules 160B, first package components 100C, a mechanical brace 450C, a mechanical brace 450B, a thermal module 460, and a SoW package 400C. The SoW package 400C may be formed in a manner similar to the SoW package 400A, and may be formed of materials similar to the materials of the SoW package 400A, but may include two regions in which the first package components 100C are bonded. In various embodiments, the SoW package 400C may be a super-large fan-out wafer-level package having an area of 10,000 mm$^2$ or greater.

Each of the first package components 100C may be placed over the SoW package 400C using a pick and place machine or the like. Once the first package components 100C are placed, the conductive connectors 432 and the conductive connectors 150 may be reflowed to bond the first package components 100C to the SoW package 400C. Although FIG. 25 illustrates first packages 200B and 200D attached to the SoW package 400B, any combination of the first packages 200A-200D may alternatively or additionally be attached to the SoW package 400B. Underfills 440 may be formed to fill the gaps between the first package components 100C and the SoW package 400C. The underfills 440 may be formed by capillary flow processes after the first package components 100C are attached, or may be formed by a suitable deposition method before the first package components 100C are attached.

Further, external connectors 434B are attached to the SoW package 400C. The external connectors 434B are electrical and physical interfaces for the SoW package 400C to other SoW packages 400C, other external systems, or the like. For example, when the SoW package 400C is installed as part of a larger external system, such as a data center, the external connectors 434B may be used to couple the SoW package 400C to the external system. Examples of external connectors 434B include large wire bonds, receptors for ribbon cables, flexible printed circuits, or the like. The external connectors 434B include pads 438, which may be similar to the UBMs 428. The external connectors 434B may include different components, such as a chassis, the pads 438, and external connection pins, which may comprise different materials. The external connectors 434B also include conductive connectors 436 on the pads 438, which may be similar to the conductive connectors 432. The pads 438 and the conductive connectors 432 are used for physical and electrical connection to the SoW package 400C. Attaching the external connectors 434B may include placing the external connectors 434B on the SoW package 400C using a pick and place machine or the like and then reflowing the conductive connectors 436 and the conductive connectors 432 to physically and electrically couple the pads 438 and UBMs 428.

Each of the modules 160B may be placed over the respective first package components 100C using a pick and place machine or the like. The mechanical brace 450C is then installed to secure each of the modules 160B to a respective first package component 100C, forming first packages 200C. The mechanical brace 450C is a rigid support that may be formed from a material with a high stiffness, such as a metal which may include steel, titanium, cobalt, or the like. The mechanical brace 450C physically engages portions of the modules 160B. Using the mechanical brace 450C to clamp the modules 160B to the first package components 100C and the SoW package 400C may reduce any warpage in the packaged device 500D.

The module 160B is fastened between the first package component 100C and the mechanical brace 450C with bolts 452C. The bolts 452C are threaded through the bolt holes 442 of the SoW package 400C and through corresponding bolt holes in the mechanical brace 450C. Fasteners 454C are threaded onto the bolts 452C and tightened to clamp the module 160B between the first package component 100C and the mechanical brace 450C. The fasteners 454C may be, for example, nuts that thread to the bolts 452C. The fasteners 454C may be tightened on the bolts 452C such that the spring-type contacts 166 are compressed. After being attached, portions of the mechanical brace 450C are disposed between the first package components 100C and between the first package components 100C and the external connectors 434B.

The mechanical brace 450B is installed to secure the thermal module 460 to a back-side of the SoW package 400C. The mechanical brace 450C may also secure the thermal module to the back-side of the SoW package 400C. The thermal module 460 may be a heat sink, a heat spreader, a cold plate, or the like. The mechanical brace 450B is a rigid support that may be formed from a material with a high stiffness, such as a metal which may include steel, titanium, cobalt, or the like. The mechanical brace 450B physically engages portions of the SoW package 400C. Using the mechanical brace 450B to clamp the thermal module 460 to the SoW package 400C may reduce any warpage in the SoW package 400C.

The thermal module 460 is fastened to the back-side of the SoW package 400C with bolts 452B. The bolts 452B are threaded through bolt holes 442 formed in the SoW package 400C and through corresponding bolt holes in the mechanical brace 450B. Fasteners 454B are threaded onto the bolts 452B and tightened to clamp the thermal module 460 to the SoW package 400C, with the SoW package 400C being disposed between the mechanical brace 450B and the thermal module 460. The fasteners 454B may be, for example, nuts that thread to the bolts 452B. After being attached, portions of the mechanical brace 450B are disposed outside of the external connectors 434B.

Before fastening together the thermal module 460 and the SoW package 400C, a thermal interface material (TIM) 462 may be dispensed on the back side of the SoW package 400C, physically and thermally coupling the thermal module 460 to the SoW package 400C. In some embodiments, the TIM 462 is formed of a film comprising indium, a thermal grease, a thermal sheet, a phase change material, combinations thereof, or the like. During fastening, the fasteners 454B and 454C are tightened, thereby increasing the mechanical force applied to the SoW package 400C by the thermal module 460 and the mechanical braces 450B and 450C. The fasteners 454B and 454C are tightened until the thermal module 460 exerts a desired amount of pressure on the TIM 462.

FIGS. 33-38 illustrate top-down views of SoW packages 400, in accordance with various embodiments. In the embodiments illustrated in FIGS. 33-35, the SoW packages 400 have circular shapes. The SoW packages 400 illustrated in FIGS. 33-35 may be intermediate structures, which may be sawed, diced, or the like to form the SoW packages 400 illustrated in FIGS. 36-38. The SoW packages 400 include various integrated circuit dies 405, such as computing dies 405A, memory dies 405B, and input/output (I/O) dies 405C. In some embodiments, the computing dies 405A may include central processing units (CPUs), graphics processing units (GPUs), application-specific integrated circuits (ASICs), field programmable gate arrays (FPGAs), or the like. The memory dies 405B may include high-bandwidth memory (HBM) dies, dynamic random access memory (DRAM) dies, hybrid memory cubes (HMCs), or the like.

Figure 33:
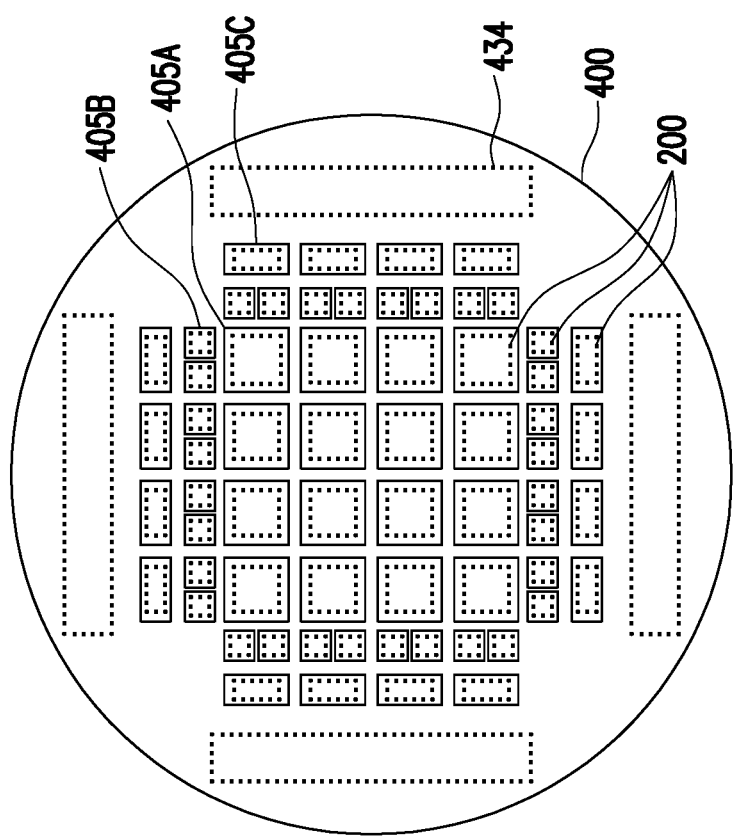
FIGS. 33-38 illustrate top-down views of packaged devices, in accordance with some embodiments.
Figure 34:
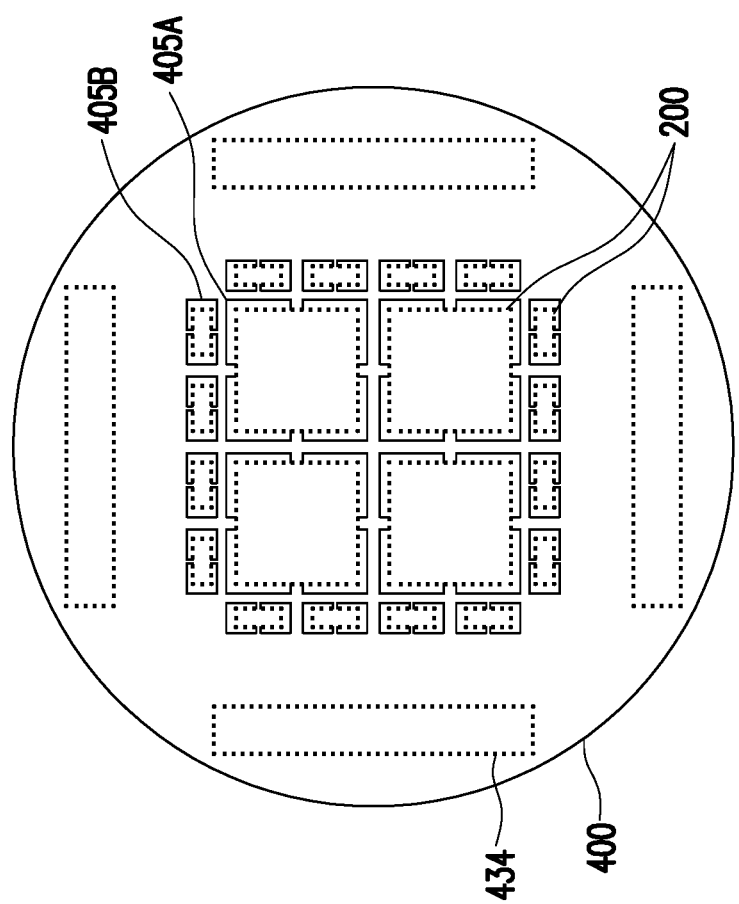
Figure 35:
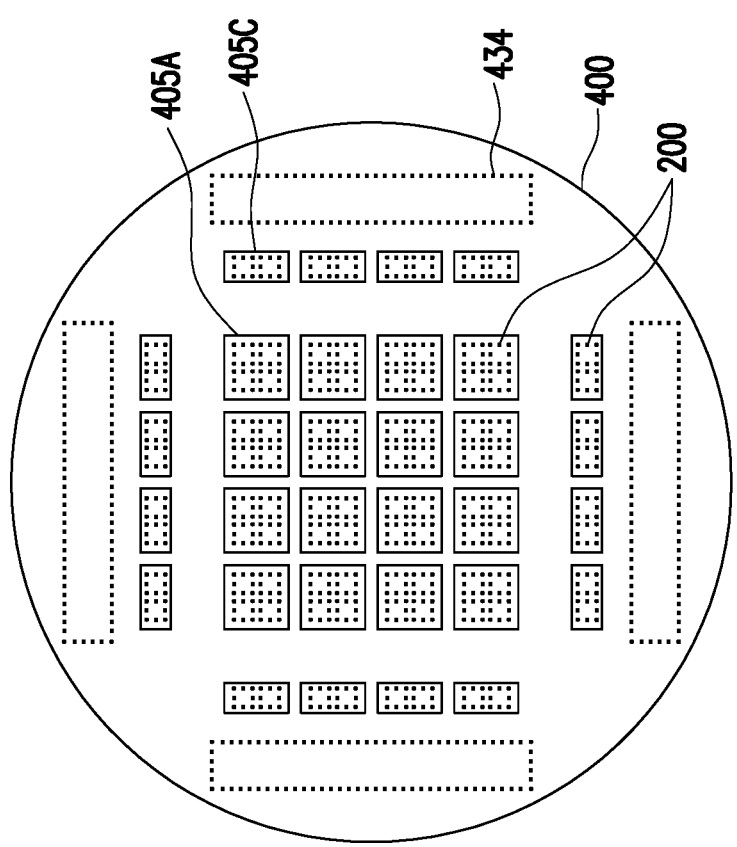

In the embodiment illustrated in FIG. 33, a first package 200 is provided over each of the integrated circuit dies 405. The first packages 200 may be any of the first packages 200A-200E discussed above. In the embodiment illustrated in FIG. 34, each pair of two memory dies 405B share a first package 200 and each set of four computing dies 405A share a first package 200. In the embodiment illustrated in FIG. 35, two of the first packages 200 may be provided for each of the I/O dies 405C and four first packages 200 may be provided for each of the computing dies 405A. Other configurations are possible and any number of first packages 200 may be provided for any number of integrated circuit dies 405. The SoW packages 400 further include external connectors 434.

Figure 36:
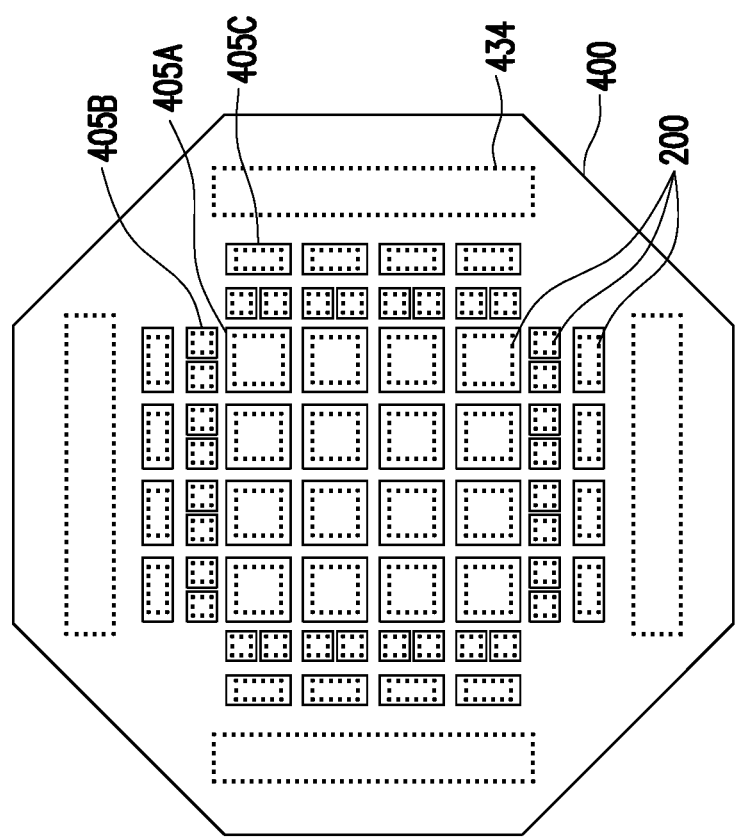
Figure 37:
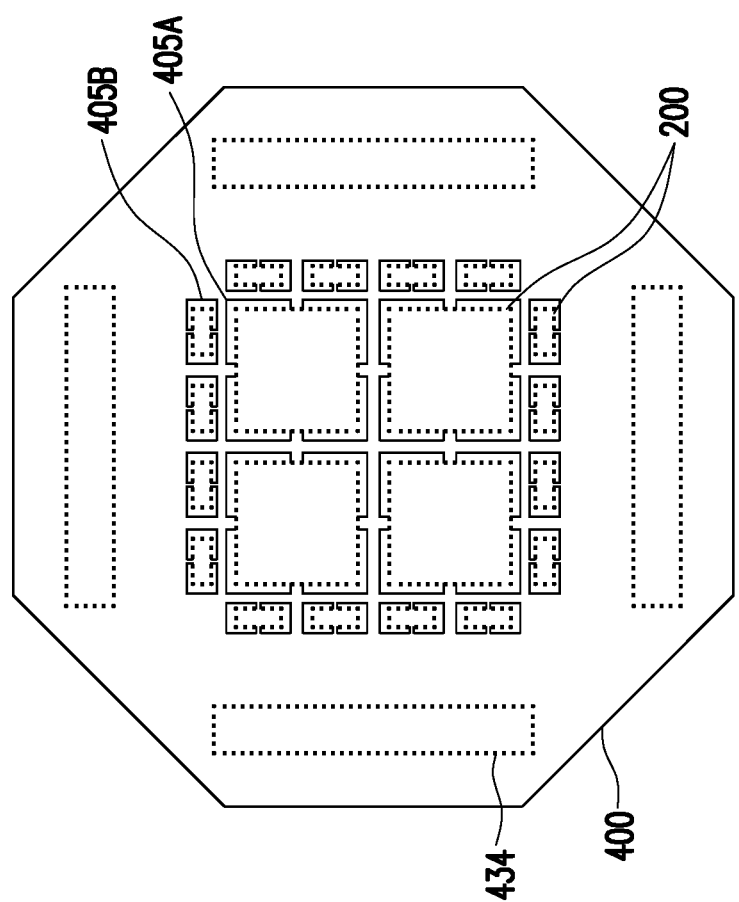
Figure 38:
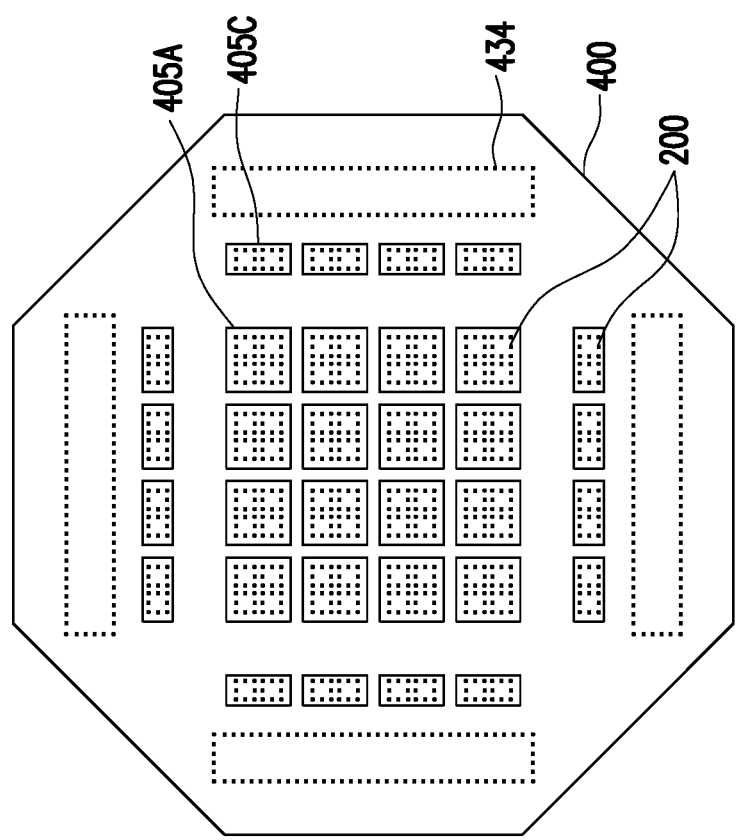

In the embodiments illustrated in FIGS. 36-38, the SoW packages 400 have octagonal shapes. This may allow for interconnected SoW packages 400 to be placed more closely to one another. The SoW packages 400 include various integrated circuit dies 405, such as computing dies 405A, memory dies 405B, and input/output (I/O) dies 405C. In the embodiment illustrated in FIG. 36, a first package 200 is provided over each of the integrated circuit dies 405. The first packages 200 may be any of the first packages 200A-200E discussed above. In the embodiment illustrated in FIG. 37, each pair of two memory dies 405B share a first package 200 and each set of four computing dies 405A share a first package 200. In the embodiment illustrated in FIG. 38, two of the first packages 200 may be provided for each of the I/O dies 405C and four first packages 200 may be provided for each of the computing dies 405A. Other configurations are possible and any number of first packages 200 may be provided for any number of integrated circuit dies 405. The SoW packages 400 further include external connectors 434.

Providing packaged devices 500 which include first package components 100 (including dies 50 disposed therein) disposed between modules 160 and SoW packages 400 reduces the distance between IPDs included in the first package components 100 and functional dies included in the SoW packages 400. This enhances power distribution network (PDN) performance. Various embodiments discussed above may be applicable to high performance computing (HPC) (e.g., an accelerator of an artificial intelligence (AI) server, a cloud computing system, an edge computing system, or the like) in data center applications, server applications, or the like.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with an embodiment, a device includes a first package component including a first integrated circuit die; a first encapsulant at least partially surrounding the first integrated circuit die; and a redistribution structure on the first encapsulant and coupled to the first integrated circuit die; a second package component bonded to the first package component, the second package component including an integrated passive device; and a second encapsulant at least partially surrounding the integrated passive device; and a power module attached to the first package component through the second package component. In an embodiment, the device further includes electrical connectors coupled to the redistribution structure, the electrical connectors encircling the second package component. In an embodiment, the second package does not include active devices disposed in the second encapsulant. In an embodiment, the power module is bonded to the second package component using solder bonds. In an embodiment, the power module is coupled to the second package using spring-type contacts. In an embodiment, the device further includes a mechanical brace extending through the first package component, the mechanical brace contacting the power module, the mechanical brace attaching the power module to the second package component. In an embodiment, the device further includes a thermal module attached to the first package component, the second package component being disposed on a first side of the first package component, and the second package component being disposed on a second side of the first package component opposite the first side. In an embodiment, the device further includes a thermal interface material disposed between the thermal module and the first package component, a mechanical brace attaching the thermal module to the first package component.

In accordance with another embodiment, a method includes forming a first package component, forming the first package component including attaching a first integrated passive device to a first redistribution structure; encapsulating the first integrated passive device with an encapsulant; and forming a second redistribution structure over the first integrated passive device and the encapsulant; attaching a power module to the second redistribution structure; and bonding the first redistribution structure to a third redistribution structure of a second package component, the second package component including a first integrated circuit die coupled to the third redistribution structure. In an embodiment, the method further includes singulating the first package component after attaching the power module to the first package component and before bonding the first package component to the second package component. In an embodiment, the power module is attached to the first package component after the first package component is bonded to the second package component. In an embodiment, attaching the power module to the first package includes placing the power module over the first package component using a pick-and-place machine and fastening the power module to the first package component using a mechanical brace, the mechanical brace including bolts extending through the second package component. In an embodiment, the power module includes spring-type contacts, and the mechanical brace applies pressure to the spring-type contacts to compress the spring-type contacts. In an embodiment, the method further includes depositing a first underfill material between the power module and the first side of the first package component and depositing a second underfill material between the second side of the first package component and the second package component.

In accordance with yet another embodiment, a device includes a first package including a plurality of integrated circuit dies; a plurality of power modules over the first package, each of the power modules being disposed directly over the integrated circuit dies in a direction perpendicular to a major surface of the first package; and a plurality of package components interposed between the integrated circuit dies and the power modules, each of the package components including an integrated passive device (IPD). In an embodiment, one of the power modules and one of the package components are disposed over each of the integrated circuit dies. In an embodiment, more than one of the power modules and more than one of the package components are disposed over each of the integrated circuit dies. In an embodiment, one of the power modules and one of the package components are disposed over more than one of the integrated circuit dies. In an embodiment, each of the package components includes a front-side redistribution structure, the IPD being disposed over the front-side redistribution structure; an encapsulant disposed over the front-side redistribution structure and surrounding the IPD; through vias extending through the encapsulant and coupled to the front-side redistribution structure; and a back-side redistribution structure over the through vias, the IPD, and the encapsulant, the back-side redistribution structure being coupled to the front-side redistribution structure through the through vias. In an embodiment, the first package has an octagonal shape in a top-down view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first package component comprising:
      a plurality of first integrated circuit dies;
      a first encapsulant at least partially surrounding the first integrated circuit dies; and
      a redistribution structure on the first encapsulant and coupled to the first integrated circuit dies;
   a second package component bonded to the first package component, the second package component comprising:
      a plurality of integrated passive devices; and
      a second encapsulant at least partially surrounding the integrated passive device; and
   a plurality of power modules attached to the first package component through the second package component, wherein each integrated passive device of the plurality of integrated passive devices is disposed directly between a respective first integrated circuit die of the plurality of first integrated circuit dies and a respective power module of the plurality of power modules in a first direction perpendicular to a major surface of the first package component, and wherein each of the power modules is disposed directly over the first integrated circuit dies in the first direction.

2. The device of claim 1, further comprising electrical connectors coupled to the redistribution structure, the electrical connectors encircling the second package component.

3. The device of claim 2, wherein the second package component does not comprise active devices disposed in the second encapsulant.

4. The device of claim 1, wherein the power modules are bonded to the second package component using solder bonds.

5. The device of claim 1, wherein the power modules are coupled to the second package using spring-type contacts.

6. The device of claim 5, further comprising a mechanical brace extending through the first package component, the mechanical brace contacting the power modules, the mechanical brace attaching the power modules to the second package component.

7. The device of claim 1, further comprising a thermal module attached to the first package component, wherein the second package component is disposed on a first side of the first package component, and wherein the thermal module is disposed on a second side of the first package component opposite the first side.

8. The device of claim 7, further comprising a thermal interface material disposed between the thermal module and the first package component, wherein a mechanical brace attaches the thermal module to the first package component.

9. A device comprising:
   a first package comprising a plurality of integrated circuit dies;
   a plurality of power modules over the first package, each of the power modules being disposed directly over the integrated circuit dies in a direction perpendicular to a major surface of the first package; and
   a plurality of package components interposed between the integrated circuit dies and the power modules, each of the package components comprising an integrated passive device (IPD).

10. The device of claim 9, wherein one of the power modules and one of the package components are disposed over each of the integrated circuit dies.

11. The device of claim 9, wherein more than one of the power modules and more than one of the package components are disposed over each of the integrated circuit dies.

12. The device of claim 9, wherein one of the power modules and one of the package components are disposed over more than one of the integrated circuit dies.

13. The device of claim 9, wherein each of the package components comprises:
   a front-side redistribution structure, the IPD being disposed over the front-side redistribution structure;
   an encapsulant disposed over the front-side redistribution structure and surrounding the IPD;
   through vias extending through the encapsulant and coupled to the front-side redistribution structure; and
   a back-side redistribution structure over the through vias, the IPD, and the encapsulant, the back-side redistribution structure being coupled to the front-side redistribution structure through the through vias.

14. The device of claim 9, wherein the first package has an octagonal shape in a top-down view.

15. A device comprising:
   a first package component, the first package component comprising:
      a first plurality of integrated passive devices coupled to a first redistribution structure;
      an encapsulant over the first redistribution structure and surrounding the first plurality of integrated passive devices; and
      a second redistribution structure over the first plurality of integrated passive devices and the encapsulant;
   a plurality of power modules coupled to the second redistribution structure; and a second package component coupled to the first package component, the second package component comprising:
- a third redistribution structure coupled to the first redistribution structure; and
- a plurality of first integrated circuit dies coupled to the third redistribution structure, wherein each of the power modules is disposed directly over a respective first integrated circuit die of the plurality of first integrated circuit dies and a respective integrated passive device of the first plurality of integrated passive devices in a first direction perpendicular to a major surface of the second package component.

16. The device of claim 15, wherein the third redistribution structure is coupled to the first redistribution structure by solder bonds.

17. The device of claim 15, wherein the power modules are coupled to the second redistribution structure using spring-type contacts.

18. The device of claim 15, wherein the power modules are attached to the first package component by a mechanical brace comprising bolts extending through the second package component.

19. The device of claim 15, further comprising a thermal module attached to the first integrated circuit die opposite the third redistribution structure.

20. The device of claim 19, further comprising a thermal interface material between the thermal module and the first integrated circuit die, wherein the thermal module is attached to the second package component by a mechanical brace comprising bolts extending through the second package component and the thermal module.

* * * * *

UNITED STATES PATENT AND TRADEMARK OFFICE
CERTIFICATE OF CORRECTION

PATENT NO. : 11,183,487 B2  
APPLICATION NO. : 16/589758  
DATED : November 23, 2021  
INVENTOR(S) : Chi-Hui Lai et al.

Page 1 of 1

It is certified that error appears in the above-identified patent and that said Letters Patent is hereby corrected as shown below:

On the Title Page

Item (72), Inventors; delete "Tin Hao Kuo" and insert --Ting Hao Kuo--.

Signed and Sealed this  
Twenty-fifth Day of January, 2022

Drew Hirshfeld  
*Performing the Functions and Duties of the*  
*Under Secretary of Commerce for Intellectual Property and*  
*Director of the United States Patent and Trademark Office*